United States Patent [19]

Hirota et al.

[11] Patent Number: 4,962,314

[45] Date of Patent: Oct. 9, 1990

[54] IMAGE TRANSFER APPARATUS

[75] Inventors: Kiyoshi Hirota; Hirokazu Kato, both of Kanagawa, Japan

[73] Assignee: Fuji Photo Film Co., Ltd., Kanagawa, Japan

[21] Appl. No.: 384,951

[22] Filed: Jul. 25, 1989

[30] Foreign Application Priority Data

| Jul. 26, 1988 | [JP] | Japan | 63-98641[U] |
| Jul. 26, 1988 | [JP] | Japan | 63-98643[U] |
| Jul. 26, 1988 | [JP] | Japan | 63-185997 |
| Aug. 19, 1988 | [JP] | Japan | 63-108949[U] |
| Oct. 6, 1988 | [JP] | Japan | 63-252498 |
| Apr. 19, 1989 | [JP] | Japan | 1-99609 |

[51] Int. Cl.$^5$ ............................................. G03C 5/16
[52] U.S. Cl. ..................................... 250/318; 250/319; 250/317.1; 355/27; 355/99; 355/100; 355/104
[58] Field of Search ..................... 250/318, 319, 312.1; 355/27, 99, 100, 104, 106, 277, 279

[56] References Cited

U.S. PATENT DOCUMENTS 4,659,927 4/1987 Tago et al.

Primary Examiner—Jack I. Berman
Assistant Examiner—Kiet T. Nguyen
Attorney, Agent, or Firm—Sughrue, Mion, Zinn, Macpeak & Seas

[57] ABSTRACT

An image transfer apparatus for transferring an image on an image sheet to an image-receiving sheet, while the image sheet and the image-receiving sheet are held in a superposed condition, comprises a working station for placing the image sheet and the image-receiving sheet one above the other on a support member to make up a transported sheet assembly, a tacking station for tentatively occuring the image sheet and the image-receiving sheet of the transported sheet assembly together, a transfer station for applying pressure and heat to the transported sheet assembly tentatively secured, and a feed mechanism for feeding the transported sheet assembly through the working station, the tacking station and the transfer station in sequence. Accordingly, the transported sheet assembly is fed automatically by the feed mechanism from the working station through the tacking station and the transfer station in sequence.

24 Claims, 29 Drawing Sheets

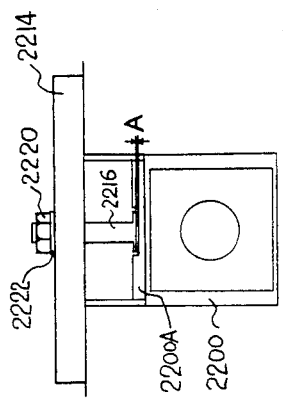

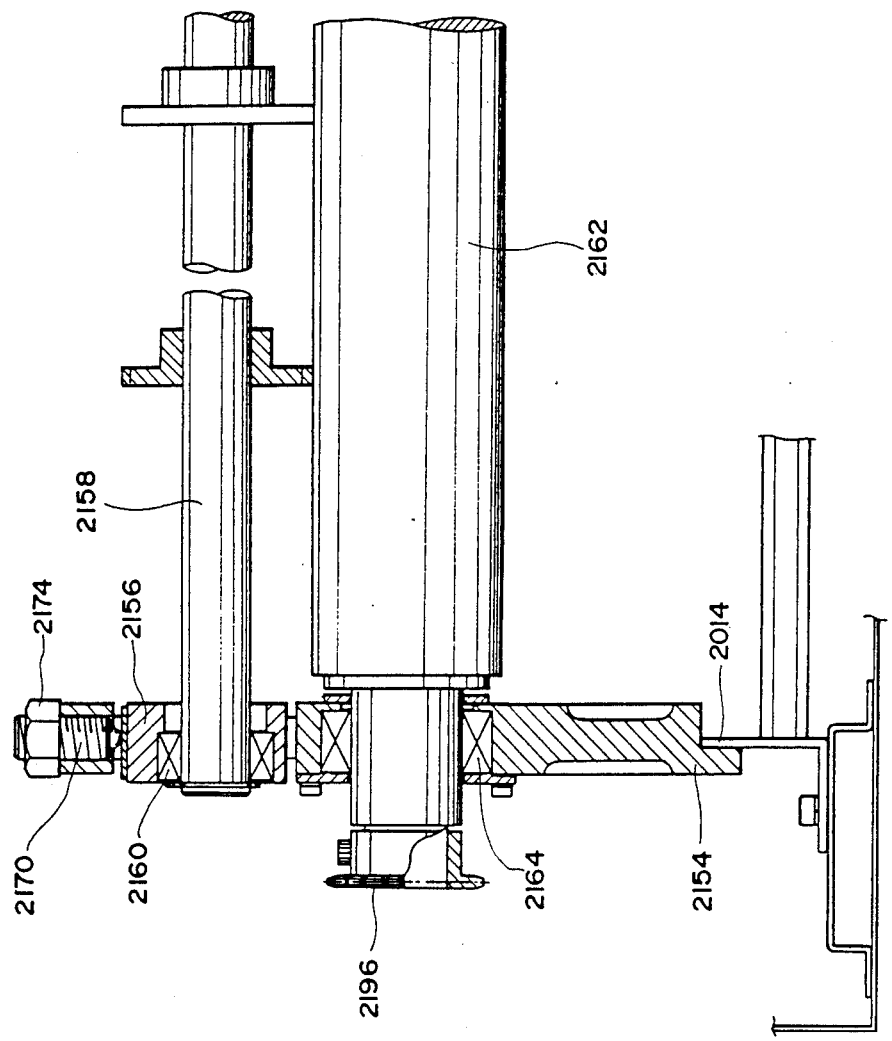

IMAGE TRANSFER APPARATUS

BACKGROUND OF THE INVENTION

The present invention relates to an image transfer apparatus for placing an image sheet and an image-receiving sheet one above the other to transfer an image on the image sheet to the image-receiving sheet.

When a number of sheets are printed by fabricating printing plates formed of plate making material, such as PS plates, from a color original, a color proof is first prepared for so-called color proof operation.

As photosensitive materials for making a color proof, there are known such photosensitive materials as those used in the silver-salt photographic process or electro-photographic process, or using photopolymers. A color proof is produced by exposing an image to such photosensitive materials for printing, then developing the printed image, and finally transferring the developed image to an image-receiving sheet.

At this time, four types of photosensitive materials are employed to prepare image sheets having respective color images of black, cyan, magenta and yellow. Then, these images are successively transferred to the same image-receiving sheet for producing a multi-color image.

Transfer apparatus for successively transferring images on four image sheets to an image-receiving sheet have been proposed in U.S. Pat. No. 4,659,927. With the proposed apparatus, each of the image sheets and the image-receiving sheet are placed on a guide plate with proper alignment, and tentatively secured or tacked together with finger pressure. Then, an operator inserts both the sheets along with a support plate into a nip between a pair of heat rollers of the transfer apparatus. While being held between the pair of heat rollers with pressure, the two sheets are advanced under heating for enabling image transfer.

However, as the place size of image sheets and image-receiving sheets is increased, support plates are also increased in the size and weight correspondingly, thus making it more troublesome to insert support plates into a transfer apparatus along with the image sheets and the image-receiving sheets placed thereon.

Further, a specific working table is required in placing the image sheet and the image-receiving sheet on the support plate, which needs an ampler working space.

A step of aligning the image sheet and the image-receiving sheet on the support plate has been so difficult to carry out that it necessitates a skill of the operator. A difficulty has also been experienced in a step of tentatively securing the sheets with finger pressure, so the step has needed a skill and spent a lot of time as well.

In addition, there has been a fear that when inserting the image sheet and the image-receiving sheet into the nip between the pair of heat rollers of the transfer apparatus along with the support plate, they might be advanced obliquely relative to the direction of insertion. In that event, satisfactory image transfer could not be achieved.

SUMMARY OF THE INVENTION

In view of the foregoing, it is an object of the present invention to provide an image transfer apparatus which can expedite the tentatively securing operation, facilitate insertion of a transported sheet assembly, comprising an image sheet and an image-receiving sheet placed on a support plate, into a transfer station, and reduce a working space.

To achieve the above object, the present invention resides in an image transfer apparatus for transferring an image on an image sheet to an image-receiving sheet, comprising a working station for placing the image sheet and the image-receiving sheet one above the other on a support member to make up a transported sheet assembly; a tacking station for tentatively securing the image sheet and the image-receiving sheet of the transported sheet assembly together; a transfer station for applying either pressure or pressure and heat to the transported sheet assembly tentatively secured in the tacking station, thereby to transfer the image to the image-receiving sheet; and feed means for feeding the transported sheet assembly from the working station through the tacking station to the transfer station in sequence.

With the above arrangement of the present invention, the image sheet and the image-receiving sheet are placed one above the other in the working station, and then inserted into the transfer apparatus under such a condition. The transported sheet assembly inserted from the working station into the interior of the apparatus is fed by the feed means through the tacking station and the transfer station in sequence. The tacking station tentatively secures the image sheet and the image-receiving sheet together in superposed relation. The transfer station transfers the image to the image-receiving sheet under pressure and/or heating by the use of heating rollers or the like.

With one mode of the present invention, the working station comprises aligning means and flattening means.

In the working station, the image sheet and the image-receiving sheet are aligned with each other by the aligning and flattening means, and then flattened by the flattening means, for example.

A receiving station is also provided which includes as its main part cooling means to cool the transported sheet assembly.

In the receiving station, the transported sheet assembly heated during image transfer is cooled by the cooling means, for example.

According to the present invention, image transfer can be effected by automatically feeding the transported sheet assembly through the working station, tacking station, transfer station, and receiving station in sequence by the feed means, with the advantageous effects of expediting the tentatively securing operation, facilitating insertion of the support member inclusive of the image sheet and the image-receiving sheet placed thereon into the transfer station, and reducing a working space.

BRIEF DESCRIPTION OF THE DRAWINGS

FIG. 22 is a sectional view taken along line VII—VII of FIG. 21;

DESCRIPTION OF THE PREFERRED EMBODIMENTS

Figure 1:
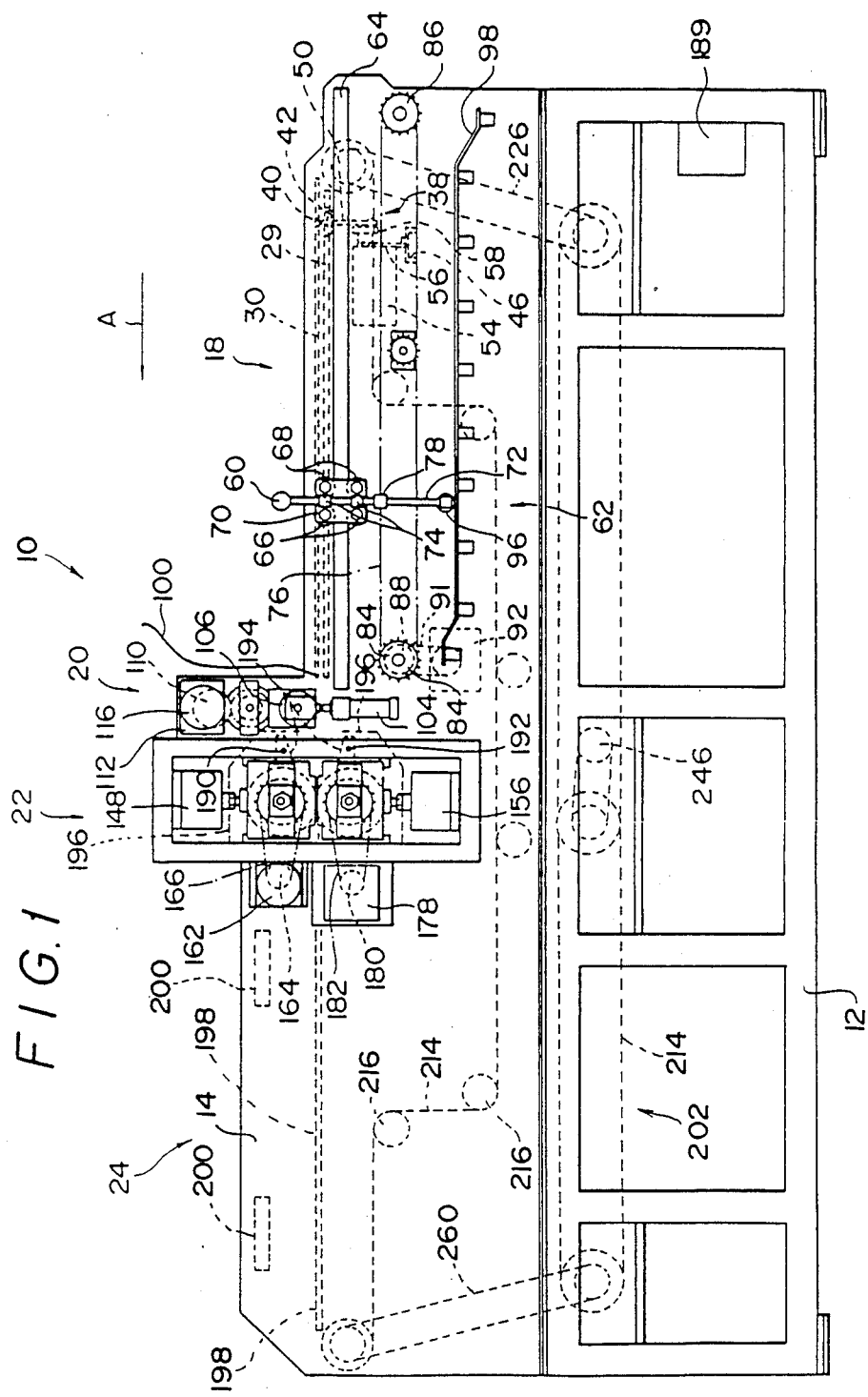
FIG. 1 is a side view showing a first embodiment of an image transfer apparatus in which the present invention is incorporated.

FIG. 1 illustrates a first embodiment of an image transfer apparatus 10 in accordance with the present invention. Specifically, FIG. 1 is a left-hand side sectional view showing schematic construction of the image transfer apparatus, and FIG. 2 is an exploded perspective view of the image transfer apparatus.

Figure 2:
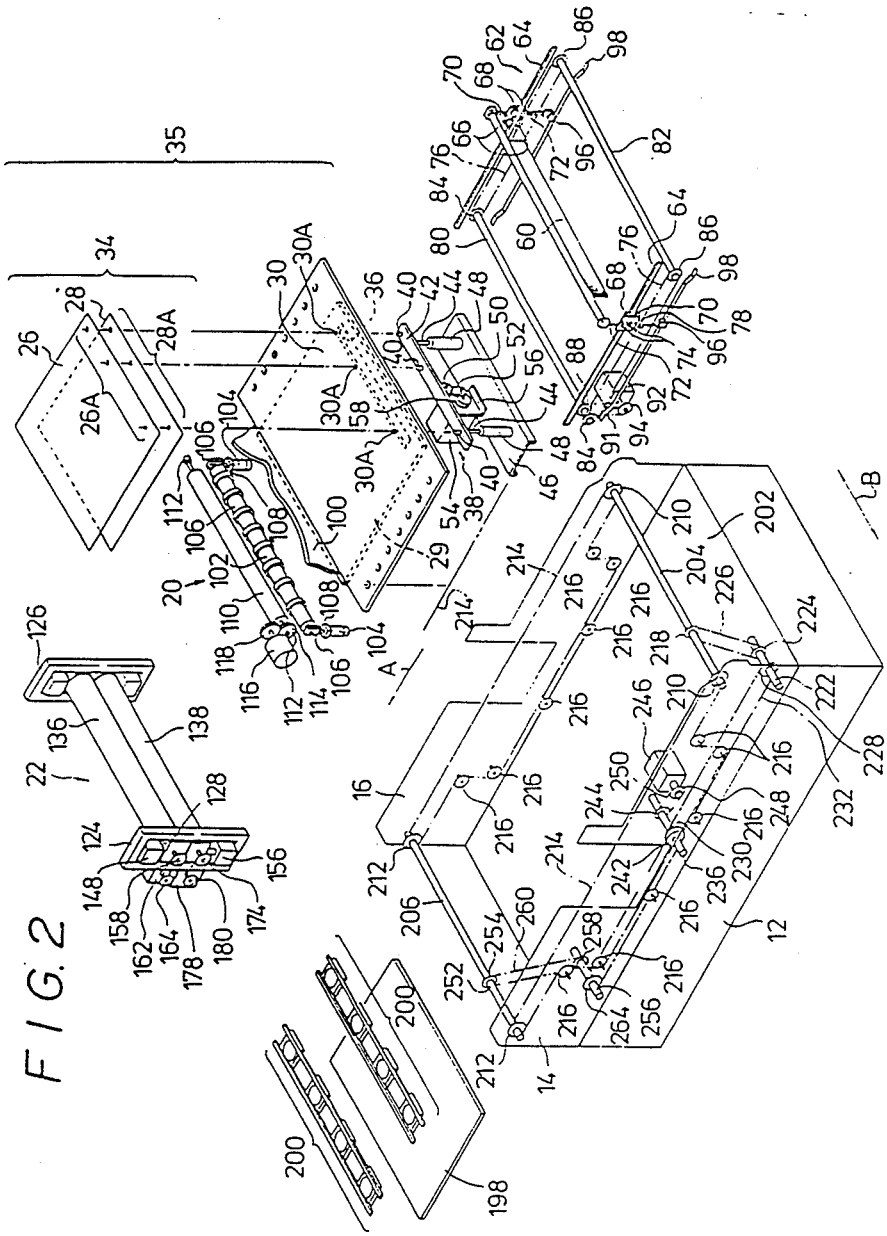
FIG. 2 is an exploded perspective view of the image transfer apparatus of the first embodiment.

As shown in FIGS. 1 and 2, the image transfer apparatus 10 has a pair of side plates 14, 16 vertically disposed on a machine base 12, and includes a working station 18, tacking station 20, transfer station 22 and cooling station 24 successively disposed in the lengthwise direction of the machine base 12. An image sheet 26 having an image printed thereon and an image-receiving sheet 28 are placed one above the other and transported through the working station 18, tacking station 20, transfer station 22 and cooling station 24, so that the image on the image sheet 26 is transferred to the image-receiving sheet 24.

The working station 18 includes a working table 29 disposed between the side plates 14 and 16. The working table 29 is supported on both sides to the side plates 14, 16, and has a guide plate 30 rested on the upper surface thereof. The image-receiving sheet 28 and the image sheet 26 are placed in this order on the guide plate 30 one above the other, i.e., in superposed relation. The guide plate 30 is coupled on both sides to respective chain belts 214 (described later) for thereby being advanced in the lengthwise direction (indicated by arrow A) of the image transfer apparatus 10. This advancement guides a transported sheet pair 34, comprising the image sheet 26 and the image-receiving sheet 28 placed one above the other, toward the tacking station 20.

The working table 29 is formed in its upstream side in the direction of advancement with a rectangular opening 36 extending in the widthwise direction (indicated by arrow B) of the image transfer apparatus 10. A flat bar 42 vertically movable by a positioning mechanism 38 can be moved into and out of the opening 36.

As shown in FIGS. 1 and 2, the positioning mechanism 38 is disposed under the working table 29. The positioning mechanism 38 has a plurality of positioning pins 40 vertically provided on the upper surface of the flat bar 42. The spacing between the adjacent two of the positioning pins 40 is set corresponding to that of through holes 30A formed in the guide plate 30 for positioning the transported sheet pair 34 on the working table 29.

The positioning pins 40 are arranged corresponding to positioning holes 26A, 28A bored through the image sheet 26 and the image-receiving sheet 28, respectively, for aligning (registering) the image sheet 26 and the image-receiving sheet 28 with each other.

Fixed to each of the lengthwise opposite ends of the flat bar 42 on the underside thereof is one end of a shaft 44. The other end of the shaft 44 is inserted in each slide bearing 48. The slide bearings 48 are fixed onto a base 46 attached to the side plates 14, 16, and support the shafts 44 in an axially movable manner.

Also, attached to a lengthwise intermediate portion of the flat bar 42 on the underside thereof is a bracket 50 through which one end of a connecting bar 52 is coupled to the flat bar 42. The other end of the connecting bar 52 is eccentrically coupled to a rotatable plate 58 in turn fixed to a drive shaft of a motor 54. The motor 54 is fixed to the base 46 through an attachment bracket 56. Accordingly, when the motor 54 is driven, the connecting bar 52 is shifted vertically to move the flat bar 42 up and down.

Above the working station 18, there is disposed a brush 60 extending along the widthwise direction (indicated by arrow B) of the working table 29. The brush 60 can be moved by a brush drive mechansim 62 in the direction of travel (indicated by arrow A) of the transported sheet 34.

The brush drive mechanism 62 has a pair of guide rails 64 positioned on the outside of and attached to the side plates 14, 16, respectively. On either side, a pair of guide rollers 66 and a pair of guide rollers 68 are disposed to hold one of guide rails 64 therebetween from above and beneath. These two pairs of guide rollers 66 and guide rollers 68 are fixed to a movable plate 70, whereby the movable plate 70 is guided in the lengthwise direction (indicated by arrow A) of the guide rail 64.

A thrust shaft 72 vertically disposed has its intermediate portion coupled to each movable plate 70 through slide bearings 74. This allows the thrust shaft 72 to move in the direction of travel of the transported sheet pair 34, as well as to move vertically.

The thrust shaft 72 is coupled through a connecting bracket 78 to a chain belt 76 disposed to extend in the direction of travel of the transported sheet pair 34. This coupling is made such that the thrust shaft 72 can move vertically with respect to the connecting bracket 78.

The chain belt 76 is stretched between and around a pair of sprockets 84, 86. The pair of sprockets 84, 86 are fixed on either side to one ends of a pair of shafts 80, 82 extending between and carried by the side plates 14, 16. These sprockets 84, 86 are arranged outside the side plates 14, 16.

A sprocket 88 is attached over the shaft 80 between the side plates 14 and 16. A chain belt 91 is stretched between and around the sprocket 88 and a sprocket 94 fixed to a drive shaft of a motor 92. The motor 92 is fixed to the side plate 14 through an attachment bracket. This permits drive power of the motor 92 to be transmitted to the shaft 80 through the sprockets 94, 88, and then to the chain belt 76 through the sprocket 84 for rotating the endless chain belt 76.

A pair of guide rollers 96 is attached to respective lower ends of the pair of thrust shafts 72, and rested on the upper surfaces of a pair of guide plates 98. The guide plates 98 are arranged to extend in the lengthwise direction of the side plates 14, 16 and fixed in place outside the side plates 14, 16. The guide plates 98 are each bent into the stepped form on the side from which the transported sheet pair 34 is to be inserted, such that the guide plate 98 has its distal end located below an intermediate portion thereof. The guide plates 98 are each also bent into the stepped form in its rear end, i.e., on the side near the tacking station 20, such that the rear end is located above the intermediate portion of the guide plate 98. Therefore, the brush 60 is forced to locate below the intermediate portions of the guide plates 98 for ease of the inserting operation by an operator, while the distal end of the brush 60 is forced to locate above apart from the transported sheet pair 34 on the side near the tacking station 20.

Attached to the guide plate 30 is one end of a cover sheet 100 on the side near the tacking station 20.

The guide plate having the image sheet and the image-receiving sheet placed one above the other thereon and covered with the cover sheet 100 from about (hereinafter referred to as a transported sheet assembly 35) is advanced toward the tacking station 20.

Figure 3:
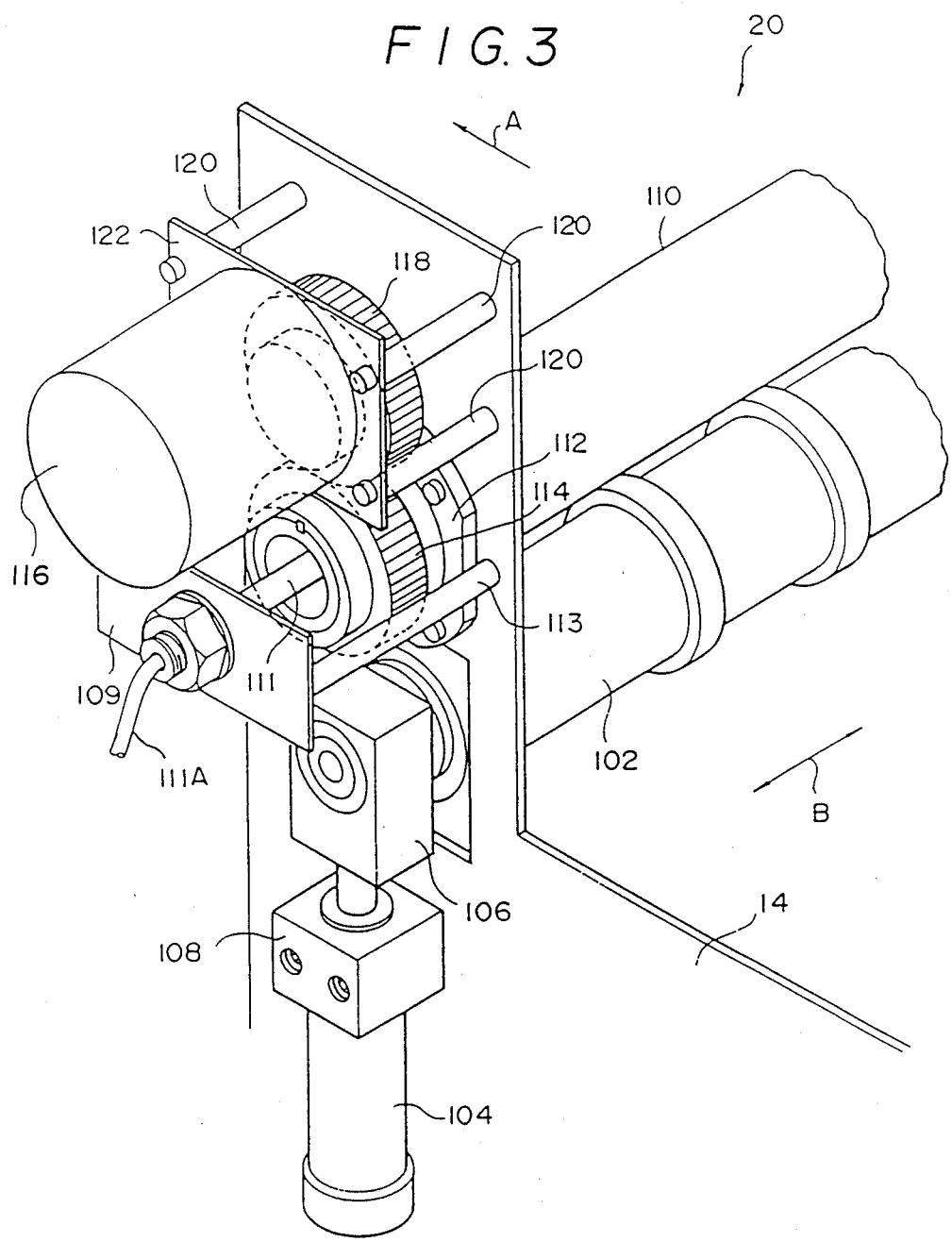
FIG. 3 is a perspective view showing the support structure of tacking rollers of the first embodiment.

In the tacking station 20, as shown in FIGS. 1 and 3, a tacking roller 102 is extending between and carried by the side plates 14, 16. The tacking roller 102 is of a stepped type roller and has a rotary shaft projecting at its opposite ends outwardly of the side plates 14, 16 for being supported by respective bearings 100. The bearings 106 are each fixed to the distal end of a drive shaft of an air cylinder 104. The air cylinder 104 is fixed to one of the side plates 14, 16 through an attachment bracket 108. The tacking roller 102 can move vertically upon operation of the air cylinders 104.

Above the tacking roller 102, there is a heat roller 110 extending between the side plates 14 and 16 and supported thereto through respective bearings 112. When the tacking roller 102 is raised up, it comes into pressure contact with the heat roller 110. The heat roller 110 has a hollow interior into which a rod heater 111 is inserted for heating the heat roller 110.

The rod heater 111 has its opposite ends projecting out of the opposite ends of the heat roller 110 for being supported to support plates 109. The support plates 109 are fixed to the side plates 14, 16 by stays 113.

Connected to a terminal of the rod heater 111 is one end of a lead wire 111A in turn connected to a power supply (not shown). This allows to energize the rod heater 111 for heating.

Between the side plate 14 and the support plate 109, a gear 114 is fitted over the projected end of the heat roller 110. The gear 114 is held in mesh with a gear 118 fitted over a drive shaft of a motor 116. The motor 116 is supported to an attachment plate 122 fixed to the side plates 14 by stays 120. Accordingly, the heat roller 110 is driven rotatively by driving the motor 116.

Figure 4:
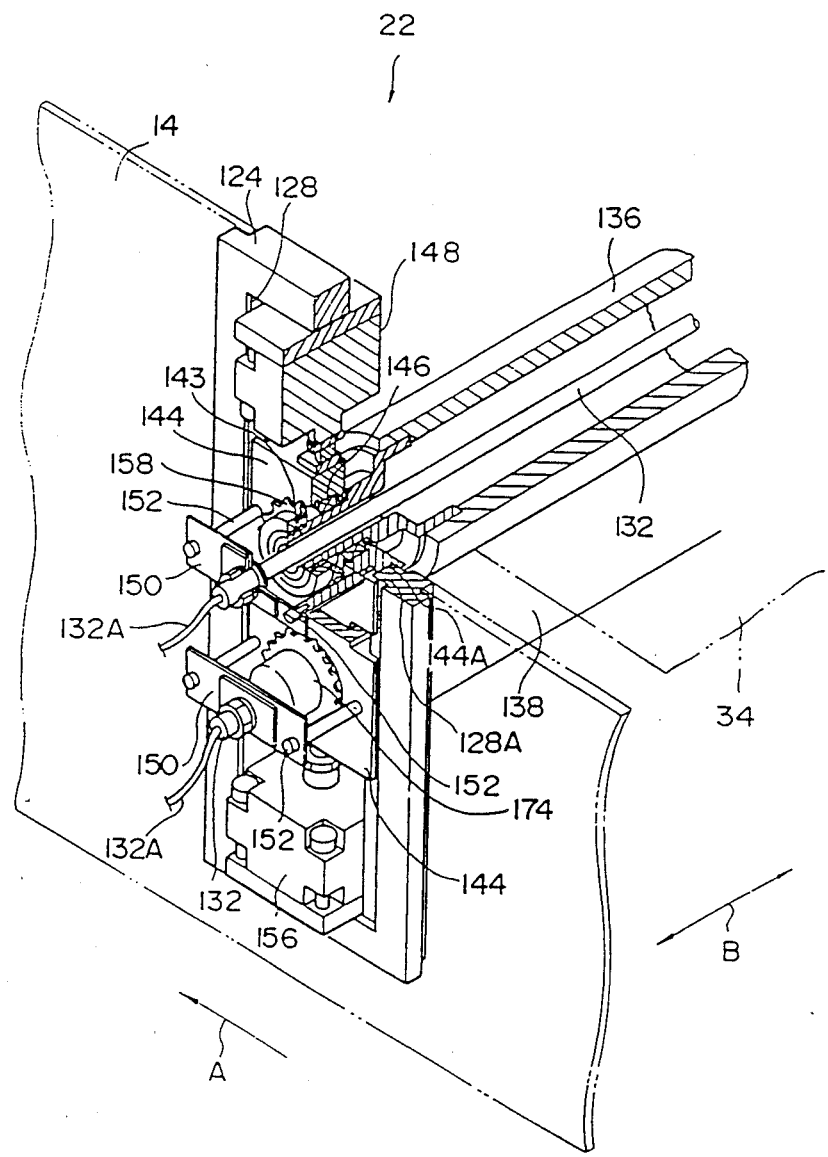
FIG. 4 is a perspective view showing the support structure of heating transfer rollers of the first embodiment.

In the transfer station 22, as shown in FIGS. 2 and 4, frames 124, 126 are attached to the side plates 14, 16, respectively. A rectangular opening 128 is defined in each of the frames 124, 126.

Heating transfer rollers 136, 138 are disposed between the frames 124 and 126.

The heating transfer rollers 136, 138 are located corresponding to upper and lower portions of the openings 128 on both sides, respectively. The transported sheet assembly 35 is inserted into a nip between the heating transfer rollers 136 and 138.

The heating transfer rollers 136, 138 are supported to the frame 124, 126 with the same structure. The supporting structure of the heating transfer roller 136 to the frame 124 will first be described.

Figure 5:
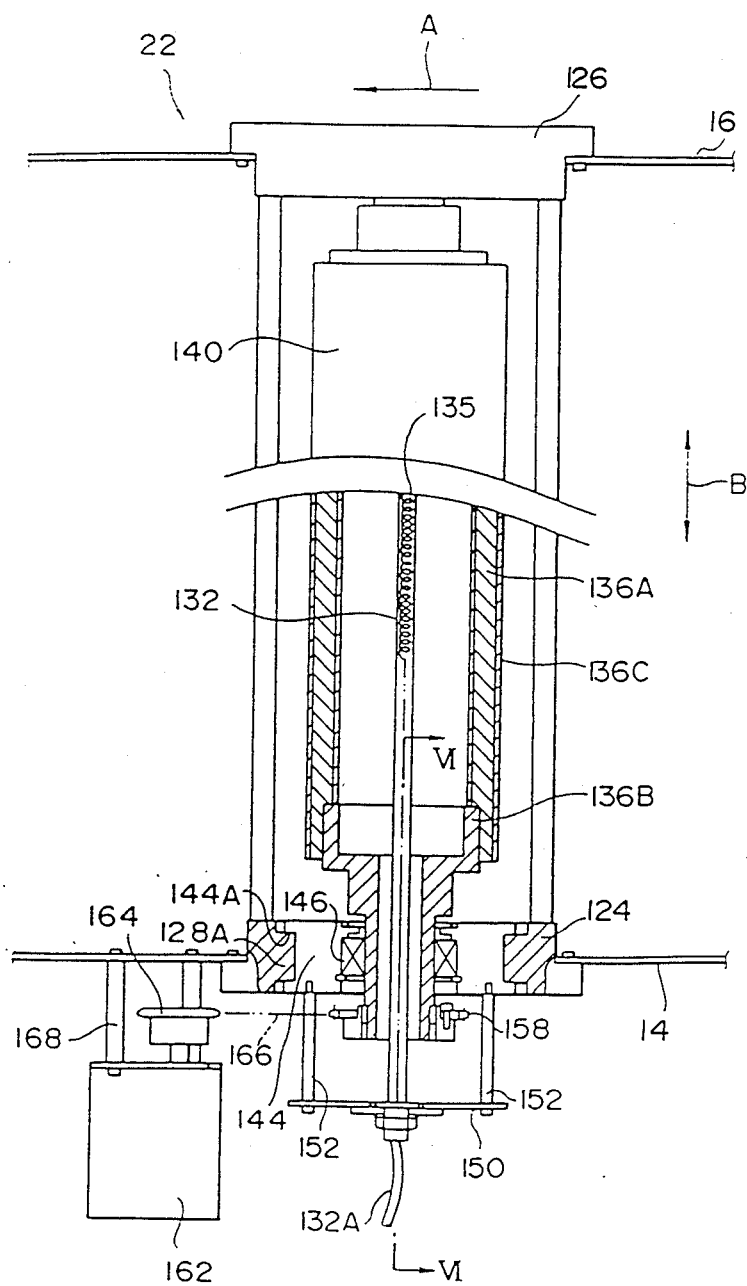
FIG. 5 is a sectional view showing the heating transfer rollers of the first embodiment.

As shown in FIGS. 4 and 5, the heating transfer roller 136 has its rotary shaft supported at the opposite ends to a pair of support blocks 144 through respective bearings 146. An air cylinder 148 is supported to an upper inner wall of the opening 128, and has a rod coupled to the support block 144. The support block 144 is formed with grooves 144A on both side faces, and projections 128A provided on opposite walls defining the opening 128 are inserted into the grooves 144A. Therefore, the support block 144 can be moved vertically upon operation of the air cylinder 148 while being guided by the projections 128A.

Figure 6:
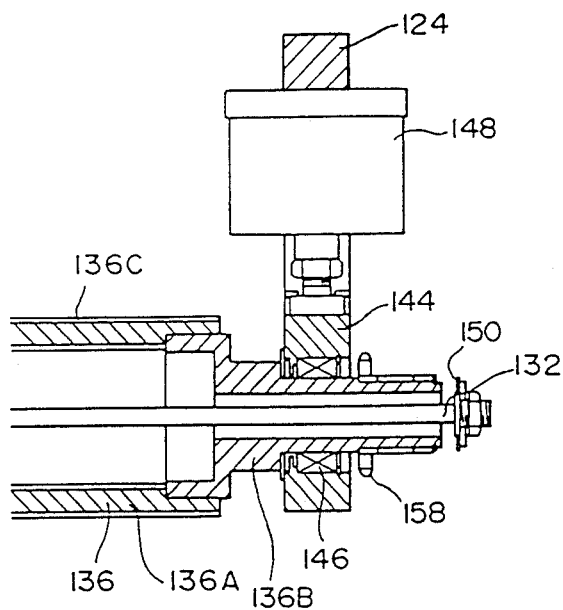
FIG. 6 is a sectional view taken along line VI—VI in FIG. 5.

The heating transfer roller 136 supported to the support block 144 has a hollow interior in which a rod heater 132 is disposed, as shown in FIGS. 4, 5 and 6. The rod heater 132 has its opposite ends projecting out of the heating transfer rollers 136 and supported to support plates 150 outside the frames 124, 126.

The support plates 150 are each supported to the support block 144 by a pair of stays 152.

The heating transfer roller 138 disposed below the heating transfer roller 136 is also supported to the support blocks 144 through respective bearings 146 in a like manner in the heating transfer roller 136. In this respect, the support block 144 supporting the heating transfer roller 138 is coupled to a rod of an air cylinder 156, which is supported to a lower inner wall of the opening 128 defined in the frame 124, so that the heating transfer roller 138 is movable vertically as with the heating transfer roller 136.

The heating transfer roller 138 has also a hollow interior in which a rod heater 132 is disposed, the rod heater 132 having its opposite ends supported to support plates 150.

When the air cylinders 148, 156 are operated, the heating transfer rollers 136, 138 are moved to approach each other for holding the transported sheet assembly 35 under pressure.

The structure of the heating transfer rollers 136, 138 will now be described by taking the heating transfer roller 136 as an example.

The heating transfer roller 136 comprises a hollow roller body 136A having its opposite ends to which shafts 136B are welded, the shafts 136B being supported by the respective bearings 146. A pressure-resistant, heat-resistant thin rubber sheet 136C is bonded to cover all over the outer peripheral surface of the roller body 136A for preventing damage as otherwise occurred when the transported sheet assembly 34 is held between the heating rollers.

The rod heater 132 disposed in the hollow interior of the heating transfer roller 136 is of a sheathed heater which has a heating element 135 enclosed therein. The heating element 135 is coiled more densely in portions corresponding to the axial opposite ends where the heating transfer roller 136 is to emit a larger amount of heat, and less densely in an axial intermediate portion thereof. This allows the heating transfer roller 136 to emit a larger amount of heat per unit length in the axial opposite end portions than in the intermediate portion. Connected to a terminal of the rod heater 132 is one end of a lead wire 132A connected to a power supply (not shown).

The heating transfer roller 138 has also the same structure as the heating transfer roller 136, with a rod heater installed in a like manner. The transported sheet assembly 35 is advanced and heated uniformly while being held between the heating transfer rollers 136 and 138 under pressure.

Between the support block 144 and the support plate 150, a sprocket 158 is attached to the projected end of the heating transfer roller 136 through a one-way clutch 143. A chain belt 166 is stretched between and around the sprocket 158 and a sprocket 164 fixed to a drive shaft of a motor 162. The motor 162 is fixed to the side plate 14 through a bracket 168. Accordingly, torque of the motor 162 is transmitted to the sprocket 158 by the chain bolt 166 for rotating the heating transfer roller 136.

Likewise, attached to the heating transfer roller 138 disposed under the heating transfer roller 136 is a sprocket 174 between the support block 144 and the support plate 138. A chain belt 182 is stretched between and around the sprocket 174 and a sprocket 180 fixed to a drive shaft of a motor 178 disposed under the motor 162. The motor 178 is fixed to the side plate 14 through a bracket 184. Accordingly, torque of the motor 178 is transmitted to the sprocket 174 by the chain belt 182 for rotating the heating transfer roller 138.

Further, as shown in FIG. 1, auxiliary heaters 190, 192 are disposed between the side plates 14 and 16 upstream of the heating transfer rollers 136 and 138 in the direction of travel of the transported sheet assembly 35. The auxiliary heaters 190, 192 are covered with respective covers 194 partially open facing the heating transfer rollers 136 and 138, so that the heating transfer rollers 136 and 138 are additionally heated at their outer peripheral surfaces.

A cover 196 is attached to surround the heating transfer rollers 136 and 138 through brackets (not shown) for shielding both the rollers from the exterior. This prevents the heat generated by the heating transfer rollers 136 and 138 from discharging to the exterior.

In the cooling station, a receiver table 198 is extending between and carried by the side plates 14, 16. The transported sheet assembly 35 fed out of the transfer station 22 is taken out onto the receiver table 198.

Fans 200 are disposed above the receiver table 198. The fans 200 serve to cool the transported sheet assembly 35 taken out onto the receiver table 198.

Next, a drive system 202 for feeding the transported sheet assembly 35 from the working station 18 through the tacking station 20 and the transfer station 22 to the cooling station 24, and then moving back it from the cooling station 24 to the working station 18 again will be described with reference to FIGS. 2 and 7.

Figure 7:
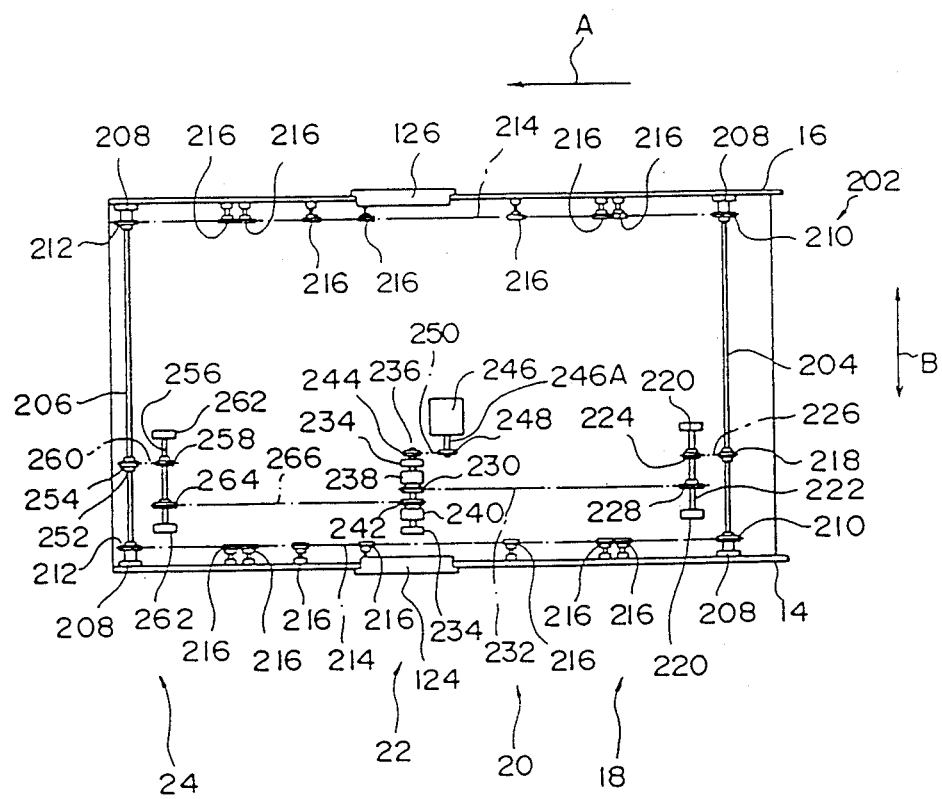
FIG. 7 is a plan view showing a drive system operated to advance a guide plate.

Between the side plates 14 and 16, as shown in FIG. 7, shafts 204, 206 are extending and supported by bearings 208 in the working station 18 and the cooling station 24, respectively. Respective pairs of sprockets 210, 212 are fixed over the shafts 204, 206. The sprockets 210, 212 are located inside the side plates 14, 16. Chain belts 214 are stretched and around the sprockets 210, 212 near the side plate 14, as well as the sprockets 210, 212 near the side plate 16. The chain belts 214 are coupled to both the sides of the guide plate 30 through brackets. This permits the guide plate 30 to be transported by the chain belts 214 from the working station 18 through the tacking station 20 and the transfer station 22 to the cooling station 24. The chain belts 214 are each bent in its travel path such that one part of the chain belt 214 is guided very closely past the stepped end portions of heating transfer rollers 136, 138, and the other part thereof travels in the lower side while being guided by idle sprockets 215 supported to the side plates 14, 16.

A transmission sprocket 218 is fixed to an intermediate portion of the shaft 204. A chain belt 226 is stretched between and around the transmission sprocket 218 and a sprocket 224 fixed over a shaft 222, which is in turn fixed to the machine base 12 through bearings 220.

Another sprocket 228 is also fixed over the shaft 222. A chain belt 232 is stretched between and around the sprocket 228 and still another sprocket 230. The sprocket 230 is fitted over a drive shaft 236 disposed at the center of the machine base 12 and having its opposite ends supported by bearings 234. A clutch 238 is disposed between the sprocket 230 and the drive shaft 236.

Also fitted over the drive shaft 236 is a sprocket 242 through a clutch 240 as with the sprocket 230. One end of the drive shaft 236 is penetrating through the bearings 234 and has a sprocket 244 fixed to the projected end thereof. A chain belt 250 is stretched between and around the sprocket 244 and another sprocket 248 fixed over a drive shaft 246A of a motor 246. The motor 246 is fixed to the machine base 12. This permits torque of the motor 246 to be transmitted to the drive shaft 236 through the sprockets 248, 244. At this time, the torque of the motor 346 can be transmitted to or interrupted from the sprockets 230, 242 upon engagement or disengagement of the clutches 238, 240.

On the other hand, a sprocket 254 is coupled to an intermediate portion of the shaft 206 through a one-way clutch 252. A chain belt 260 is stretched between and around the sprocket 254 and a sprocket 258 fixed over a shaft 256. The shaft 256 is in turn fixed to the machine base 12 through bearings 262.

Another sprocket 264 is also fixed over the shaft 256. A chain belt 266 is stretched between and around the sprocket 264 and the sprocket 242. With such arrangement, the torque of the motor 246 transmitted to the drive shaft 236 is then transmitted to the shaft 256 as well through the sprockets 242, 264.

In addition, the image transfer apparatus 10 includes a control unit 189 for controlling operation of the image transfer apparatus 10. Electrical connection between the control unit 189 and the respective components will now be described with reference to a block diagram shown in FIG. 8. The control unit 189 comprises a RAM 191, ROM 193, CPU 195 and input/output ports 197, which interconnected via a data bus 199.

Figure 8:
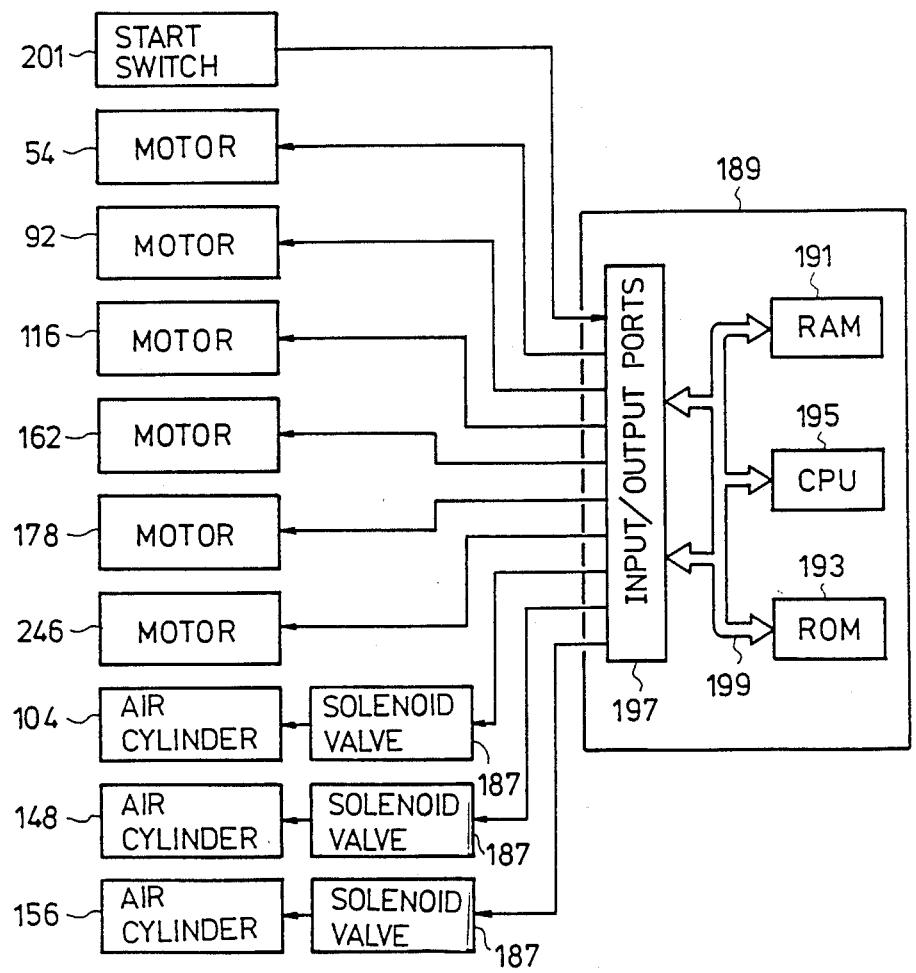
FIG. 8 is a control block diagram showing electrical connections between a control unit and other components.

As shown in FIG. 8, a start switch 201 for starting up the image transfer apparatus 10 is connected to the input side of the input/output ports 197. The motors 54, 92, 116, 162, 178, 246 are connected to the output side thereof, so do the air cylinders 104, 148, 156 through respective solenoid valves 187.

Figure 9:
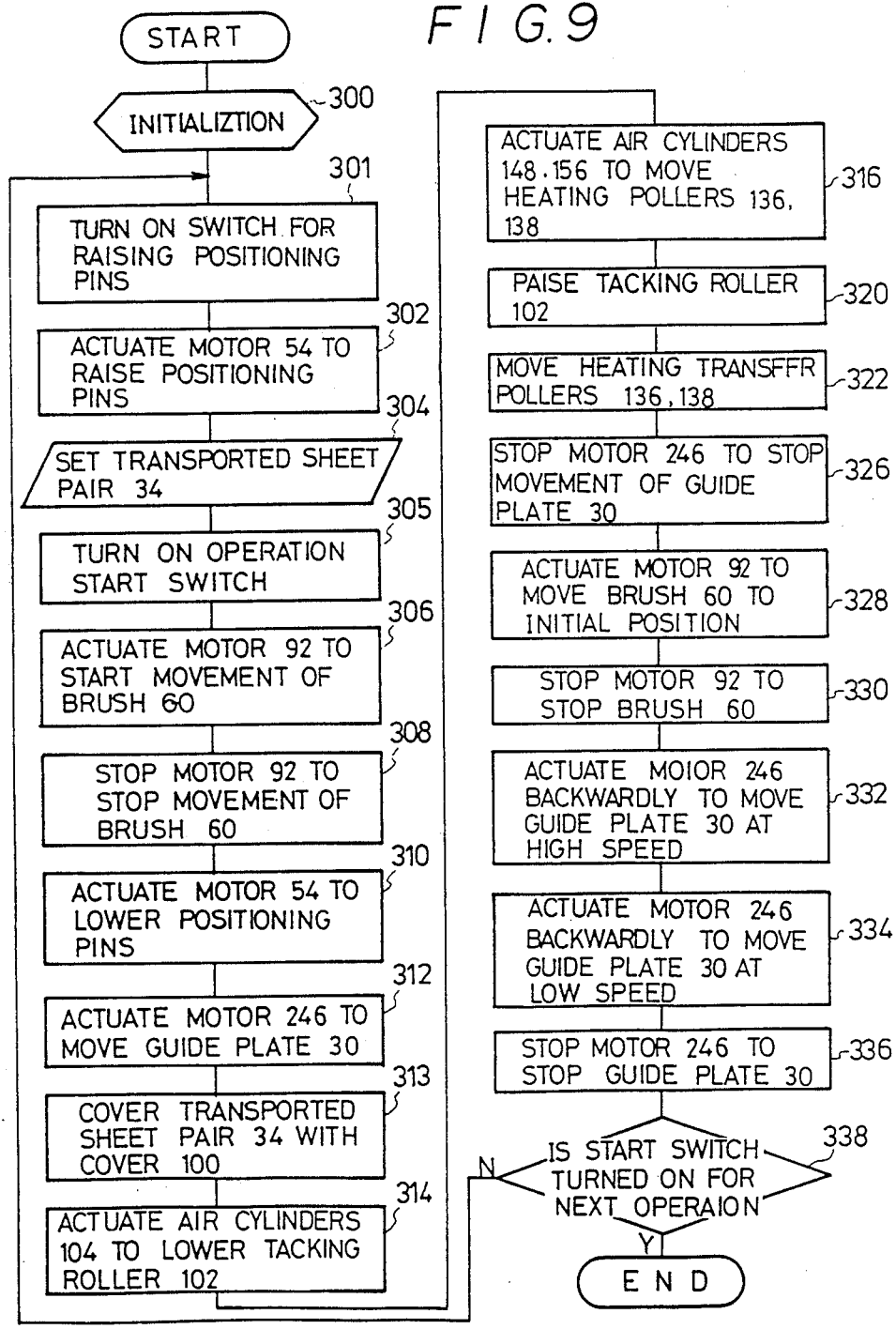
FIG. 9 is a flowchart showing operation of the image transfer apparatus of the first embodiment.

Operation of this embodiment will be described below with reference to a flowchart shown in FIG. 9.

When electric power is applied to the image transfer apparatus 10 by turning on the start switch 201, the image transfer apparatus 10 is initialized in a step 300. With this initialization, the transported sheet pair 34 is moved to a certain position in the working station 18 and the positioning pins 40 are also moved to a lower certain position. The brush 60 is positioned on the side from which the transported sheet pair 34 is to be inserted. The air cylinders 104 are actuated to move the tacking roller 102 upwardly into a pressure contact with the heat roller 110. The heating transfer rollers 136, 138 are moved apart from each other by the air cylinders 148, 156. Thus, the apparatus is brought into an open condition that the travel path of the transported sheet assembly 35 is open.

Under such a condition, the motors 162, 178 are actuated to rotate the heating transfer rollers 136, 138.

The fans 200 also start operation for supplying air into the cooling station 24.

In addition, the respective heaters start heating the heat roller 110 and the heating transfer rollers 136, 138.

At the point when the temperature of the heating transfer rollers is increased and so adjusted as to enable transfer, a start switch for raising the positioning pins 40 is turned on (step 301).

The motor 54 is then actuated in a step 302 to raise the positioning pins 40 together with the flat bar 42. This causes the flat bar 42 to enter the opening 36 in the working table 29, and the positioning pins 40 to penetrate the through holes 30A of the guide plate 30 and project above the guide plate 30. The image-receiving sheet 28 is set on the plate 30 by fitting the positioning holes 28A of the image-receiving sheet 28 over the positioning pins 40. The image sheet 26 is then set over the image-receiving sheet 28 by fitting the positioning holes 26A of the image sheet 26 over the positioning pins 40. At this time, the image sheet 26 and the image-receiving sheet 28 can easily be aligned with each other with the aid of the positioning pins 40.

After setting the transported sheet pair 34 on the working table 29 in a step 304, an operator turns on a start switch (not shown) in a step 305.

In a step 306, the motor 92 is actuated to move the brush 60 from the insertion side of the transported sheet pair 34 toward the downstream side. This allows to remove air left between the image sheet 26 and the image-receiving sheet 28 for flattening.

When the brush 60 is moved up to a position just short of the tacking station 20, the motor 92 is stopped in operation to stop movement of the brush 60 in step 308.

In a next step 310, the motor 54 is actuated to lower the positioning pins 40. This causes the positioning pins 40 to withdraw from the guide plate 30. The motor 246 is actuated to move the working table 29 toward the tacking station 20 in a step 312.

At this time, a cover 100 is forced to cover the transported sheet pair 34 in a step 313 as the transported sheet pair 34 advances. Simultaneously, the air cylinders 104 are actuated to lower the tacking roller 102 in a step 314. The tacking roller 102 presses the transported sheet pair 34 through the cover 100 under heating, thereby to tentatively secure the transported sheet pair 34 beginning with the leading end thereof. Note that the tacking roller 102 is in contact with the heat roller 110 for being heated, when it is held in a raised position by the air cylinders 104.

Because the tacking roller 102 is in the form of a stepped type roller, a plurality of tacked or tentatively secured positions are provided normal to the direction of travel of the transported sheet assembly 35. Therefore, air present between the adjacent ones of the tacked positions can easily be escaped rearwardly in the direction of travel. When the transported sheet assembly 35 is advanced while being held between the heating transfer rollers 136 and 138 in a next step 316, the air is pushed out without causing any air bubbles between the image sheet and the image-receiving sheet during transfer.

In the step 316, the air cylinders 118, 156 are actuated to lower the heating transfer roller 136 and raise the heating transfer roller 138. This closes the travel path of the transported sheet assembly 35, whereupon the the one-way clutch 143 in the sprocket 158 is brought into action to synchronize a circumferential speed of the heating transfer roller 138 with that of the heating transfer roller 136. In practice, the circumferential speed of the heating transfer roller 136 is set slower than that of the heating transfer roller 138. The transported sheet assembly 35 is inserted into a nip between the heating transfer rollers 136 and 138. Thus, the transported sheet assembly 35 advanced and heated while being held between the heating transfer rollers 136 and 138 under pressure, so that image transfer is performed during the advancement.

After the transported sheet assembly 35 has passed the tacking station 20, the tacking roller 102 is raised again in a step 320. In a next step 322, the heating transfer rollers 136, 138 are so moved as to open the travel path of the transported sheet assembly 35.

In this connection, the transported sheet assembly 35 is advanced by the motor 246 to the transfer station 22, but thereafter advanced by the motor 178. In other words, the speed at which the transported sheet assembly 35 is advanced by drive power of the motor 178 is set higher than that by drive power of the motor 246, and the motor 246 is coupled to the shaft 206 through the one-way clutch 254, whereby the transported sheet assembly 35 is advanced by the motor 178 employed for driving the heating transfer rollers 136, 138 during image transfer under heating.

At the point when the transported sheet assembly 35 is completely fed out of the transfer station 22, the motor 246 is stopped in operation to stop movement of the guide plate 30 in a step 326. At this time, the transported sheet assembly 35 is already advanced to the cooling station 24 where the transported sheet assembly 35, which has been heated up to a higher temperature in the transfer station 22, is cooled.

In a step 328, the motor 92 is actuated to start moving the brush 60 back to its intitial position.

In a step 330, the motor 92 is reversed in the drive direction to move the brush 60 toward the positioning mechanism 38 before stoppage.

In a next step 332, the motor 246 is now driven backwardly for moving the guide plate 30 back to the working station 18 at a higher speed. The guide plate 30 having been moved back to the end of the working table 18 at a higher speed is lowered in speed 334 and then stopped in a step 336.

Image transfer is thus brought into the end. Then, the image sheet 126 as a base layer is peeled off from the image-receiving sheet 28 by lifting up the cover sheet 100 of the guide plate 30, followed by removing the image-receiving sheet 28 out of the guide plate 30.

In a next step 338, the operator determines whether to return to the flow point after the step 300 or terminate the control. In case of returning the flow point after the step 300, the aforementioned subsequent steps will be executed again.

With this embodiment, as described above, since the guide plate 30 including the transported sheet pair placed thereon is fed automatically from the working station 18 through the tacking station 20 and the transfer station 22 to the cooling station 24 by the drive system for feeding, it becomes possible to expedite the tentatively securing operation and facilitate insertion of the guide plate 30 including the image sheet 26 and the image-receiving sheet 28 placed thereon into the transfer station 22. Further, an additional working table is not required to place the image sheet 26 and the image-receiving sheet 28 on the guide plate 30 with proper alignment. Thus, no need of installation space for such a working table enables to reduce a working space.

Also, with this embodiment, alignment of the image sheet 26 and the image-receiving sheet 28 can be so facilitated that no skill is required and anyone can register both the sheets with ease.

Automated process contributes to improve the productivity and lower the cost.

In addition, although the above embodiment has been described as placing the developed image sheet 26 over the image-receiving sheet 28 for image transfer from the former to the latter, the apparatus of the present invention is also applicable to the case in which the image-receiving sheet 28 having the image transferred thereto is placed on another transferred sheet, such as paper, for transferring that image once again. In this case, image transfer may be performed without using the positioning pins 40 of the positioning mechanism 38 and the tacking roller 102 of the tacking station 20.

Next, a second embodiment of the present invention will be described with reference to FIGS. 10-12.

The same members and components in this embodiment as those in the first embodiment are denoted by the same reference numerals, and their description is omitted here.

The embodiment is basically different from the first embodiment only in the transfer station.

Figure 10:
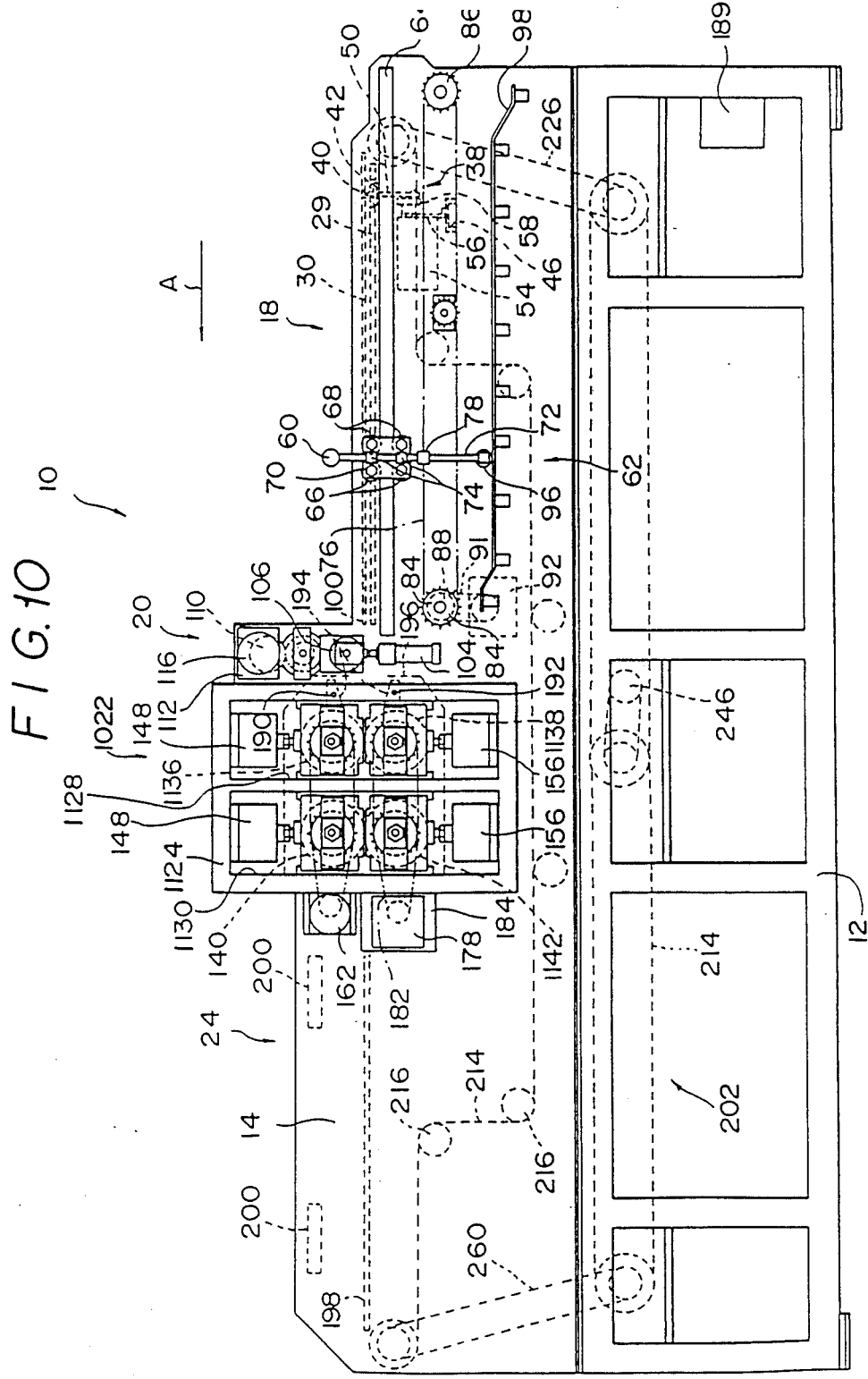
FIG. 10 is a side view showing a second embodiment of an image transfer apparatus in which the present invention is incorporated.
Figure 11:
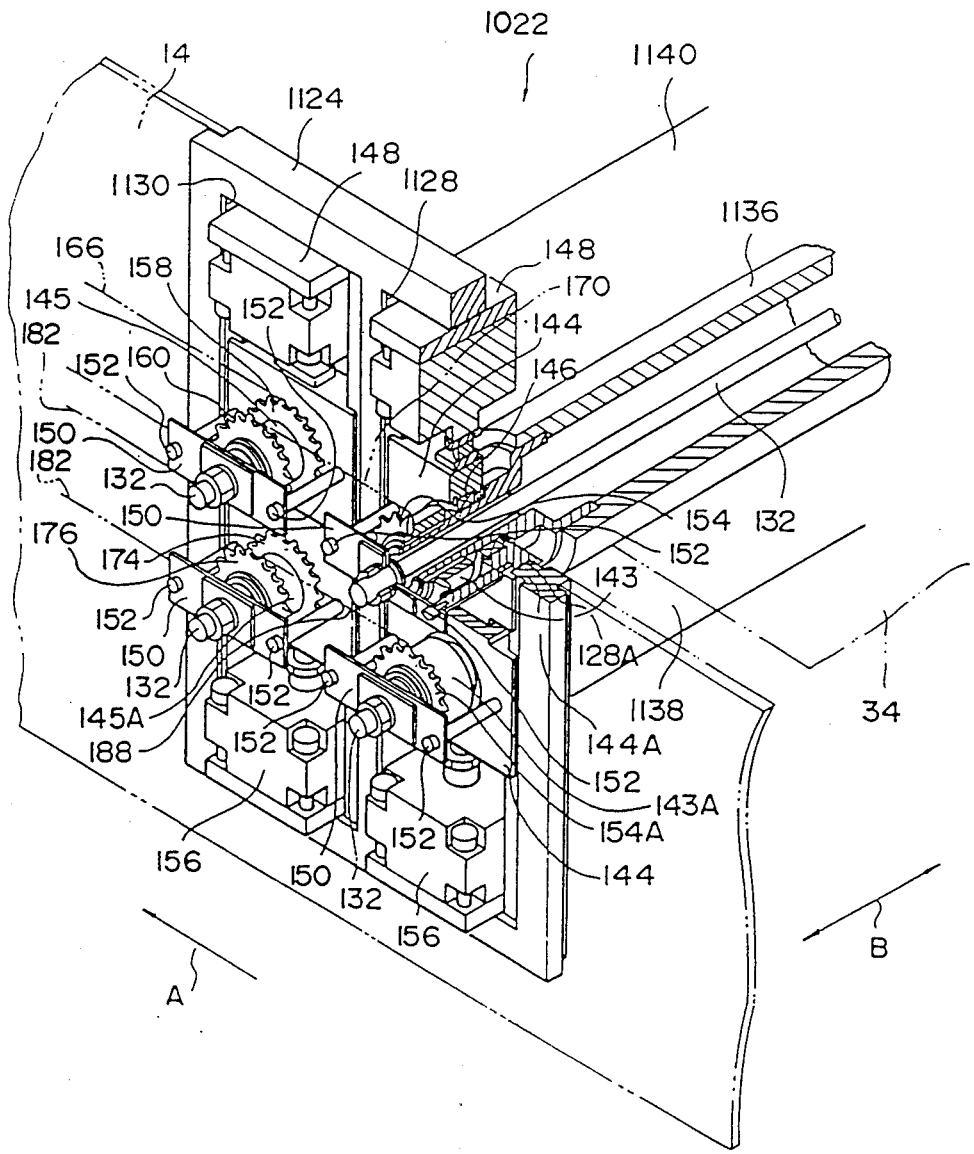
FIG. 11 is a perspective view showing the support structure of heating transfer rollers of the second embodiment.
Figure 12:
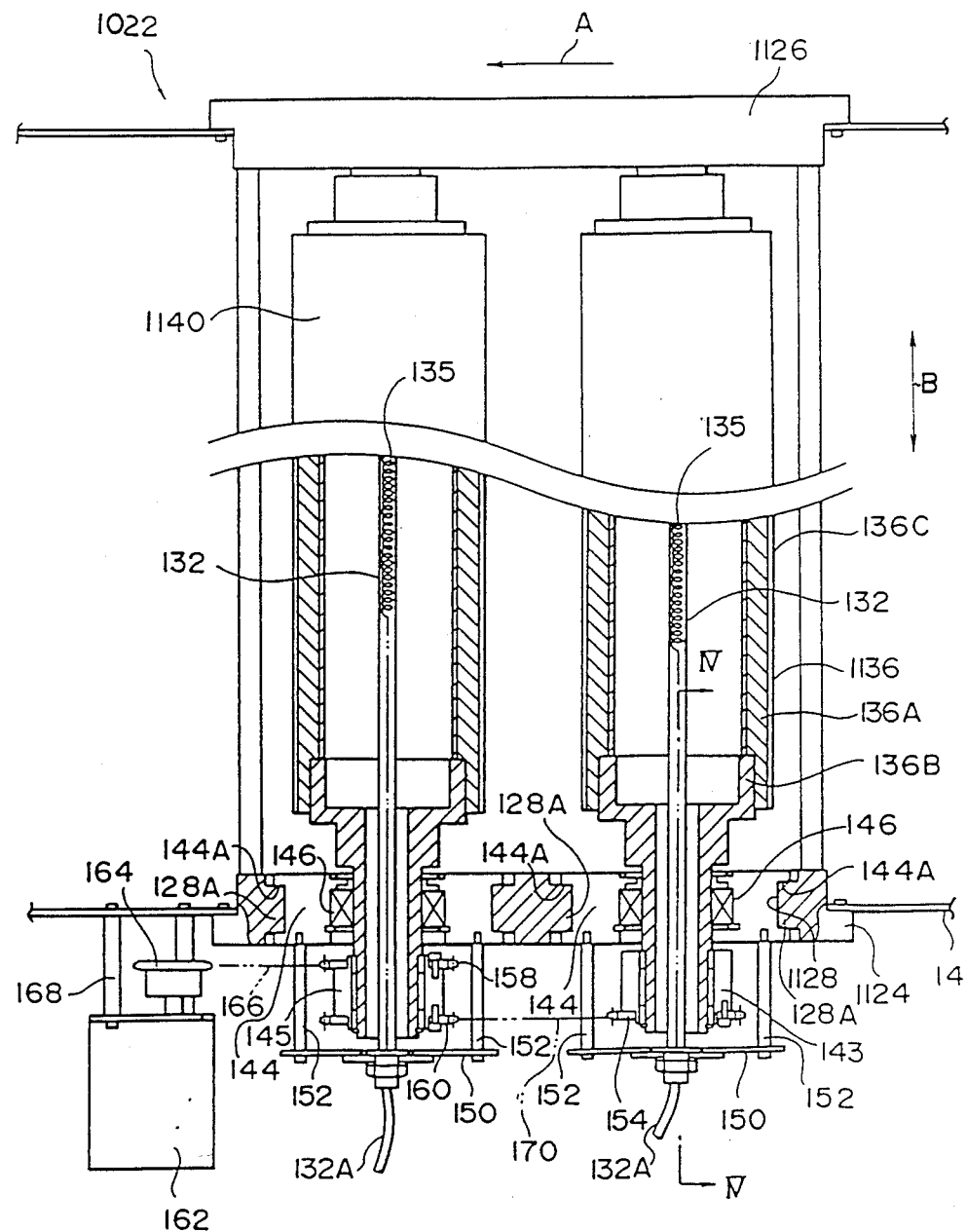
FIG. 12 is a sectional view showing the heating transfer rollers of the second embodiment.

In a transfer station 1022, as shown in FIGS. 10 and 11, frames 1124, 1126 are attached to side plates 14, 16, respectively. A pair of rectangular openings 1128, 1130 is defined in each of the frames 1124, 1126 side by side in the direction of travel of the transported sheet pair 34 in this order.

Heating transfer rollers 1136, 1138, 1140, 1142 are disposed for being extended between and carried by the frames 1124 and 1126.

The heating transfer rollers 1136, 1138 are located corresponding to the openings 1128 of the frames 1124, 1126; i.e., the heating transfer roller 1136 is located in upper portions of the openings 1128 and the heating transfer roller 1138 is located in lower portions of the openings 1128 on both sides, respectively. Also, the heating transfer rollers 1140, 1142 are located corresponding to the openings 1130 of the frames 1124, 1126; i.e., the heating transfer roller 1140 is located in upper portions of the openings 1130 and the heating transfer roller 1142 is located in lower portions of the openings 1130 on both sides, respectively. The transported sheet pair assembly 35 is inserted into nips between the heating transfer rollers 1136, 1138 and between the heating transfer rollers 1140, 1142.

The supporting structure of the heating transfer rollers 1136, 1138 and the heating transfer rollers 1140, 1142 to the frames 1124, 1126 is substantially the same as that of the heating transfer rollers 136, 138 to the frames 124, 126 in the first embodiment, and the structure of the heating transfer rollers 1136, 1138, 1140, 1142 themselves is the same as that of the heating transfer rollers 136, 138 themselves in the first embodiment. So, there will be described only different features.

In this embodiment, between a support plate 150 and a support block 144, a sprocket 154 is attached to one end of a shaft of the heating transfer roller 1136 through a one-way clutch 143. This one-way clutch 143 serves to synchronize an outer circumferential speed of the heating transfer roller 1136 with that of the heating transfer roller 1140 disposed on the downstream side during travel of the transported sheet pair 34. Likewise, between the support plate 150 and the support block 144, a sprocket 154A is attached to one end of a shaft of the heating transfer roller 1138 through a one-way clutch 143A. This one-way clutch 143A serves to synchronize an outer circumferential speed of heating transfer roller 1138 with that of the heating transfer roller 1142 disposed on the downstream side during travel of the transported sheet pair 34.

The heating transfer roller 1140 has its shaft penetrating through the support block 144 and projecting out of the frame 124. Attached over this projected end of the shaft are sprockets 158, 160 through one-way clutch 145 between the support block 144 and the support plate 150. A chain belt 166 is stretched between and around the sprocket 158 and a sprocket 164 fixed to a drive shaft of a motor 162. The motor 162 is fixed to the side plate 14 through a bracket 168. Accordingly, torgue of the motor 162 is transmitted to the sprocket 158 by the chain belt 166 for rotating the heating transfer roller 1140.

Another chain belt 170 is stretched between ands around the sprocket 160 and the sprocket 154 on the shaft of the heating transfer roller 1136, so that the torque of the motor 162 transmitted to the heating transfer roller 1140 through the sprocket 158 is further transmitted to the heating transfer roller 1136.

For the heating transfer roller 1142 disposed under the heating transfr roller 1140, as with the heating transfer roller 1140, sprockets 174, 176 are attached over one end of a shaft of the heating transfer roller 1142 through one-way clutch 145A between the suport plate 144 and the support plate 150. A chain belt 182 is stretched between and around the sprocket 174 and a sprocket 180 fixed to a drive shaft of a motor 178 disposed under the motor 162. The motor 178 is fixed to the side plate 14 through a bracket 184. Accordingly, torque of the motor 178 is transmitted to the heating transfer roller 1142 by the chain belt 182 for rotating the heating transfer roller 1142.

Another chain belt 188 is stretched between and around the sprockets 176 and 154A, so that the torque transmitted to the heating transfer roller 1142 is further transmitted to the heating transfer roller 1138.

In this connection, the outer diameter of the heating transfer roller 1142 is set to be not smaller than that of the heating transfer roller 1138. More specifically, the difference in outer diameter between the heating transfer roller 1138 and the heating transfer roller 1142 is in a range about 0 to 0.1 mm, preferably approximately 0.05 mm. Therefore, when the heating transfer rollers 1138, 1142 are rotated with the torque of the motor 178, the heating transfer roller 1142 has and outer circumferential speed equal to or higher than that of the heating transfer roller 1138. Further, the motor 162 or a torque transmission device associatd therewith is so set that the heating transfer rollers 1136, 1140 positioned above the travel path of the transported sheet pair 34 have an outer circumferential speed equal to or lower than that of the heating transfer roller 1142 positioned under the travel path. Therefore, the transported sheet pair 34 advanced by the heating transfer rollers 1136, 1138, 1140, 1142 can travel in a horizontal attitude free of any slack between the heating trasfer rollers on the upstream and downstream sides, or in a slightly tensioned condition. In case of rather strong tension, however, the one-way clutches 143, 143A, 145 are brought into action such that torque of the heating transfer roller 1142 is directly transmitted to the other heating transfer roller 1142 is directly transmitted to the other heating transfer rollers 1136, 1138, 1140 throught the transported sheet pair 34, thereby making a outer circumferential speed of the heating transfer rollers 1136, 1138, 1140 equal to that of the heating transfer roller 1142. As a result, the transported sheet pair 34 is transported at the same speed, and there occurs no shift between the image sheet and the image-receiving sheet.

The remaining arrangement of this embodiment is similar to that of the first embodiment and hence will not be explained again.

Figure 13:
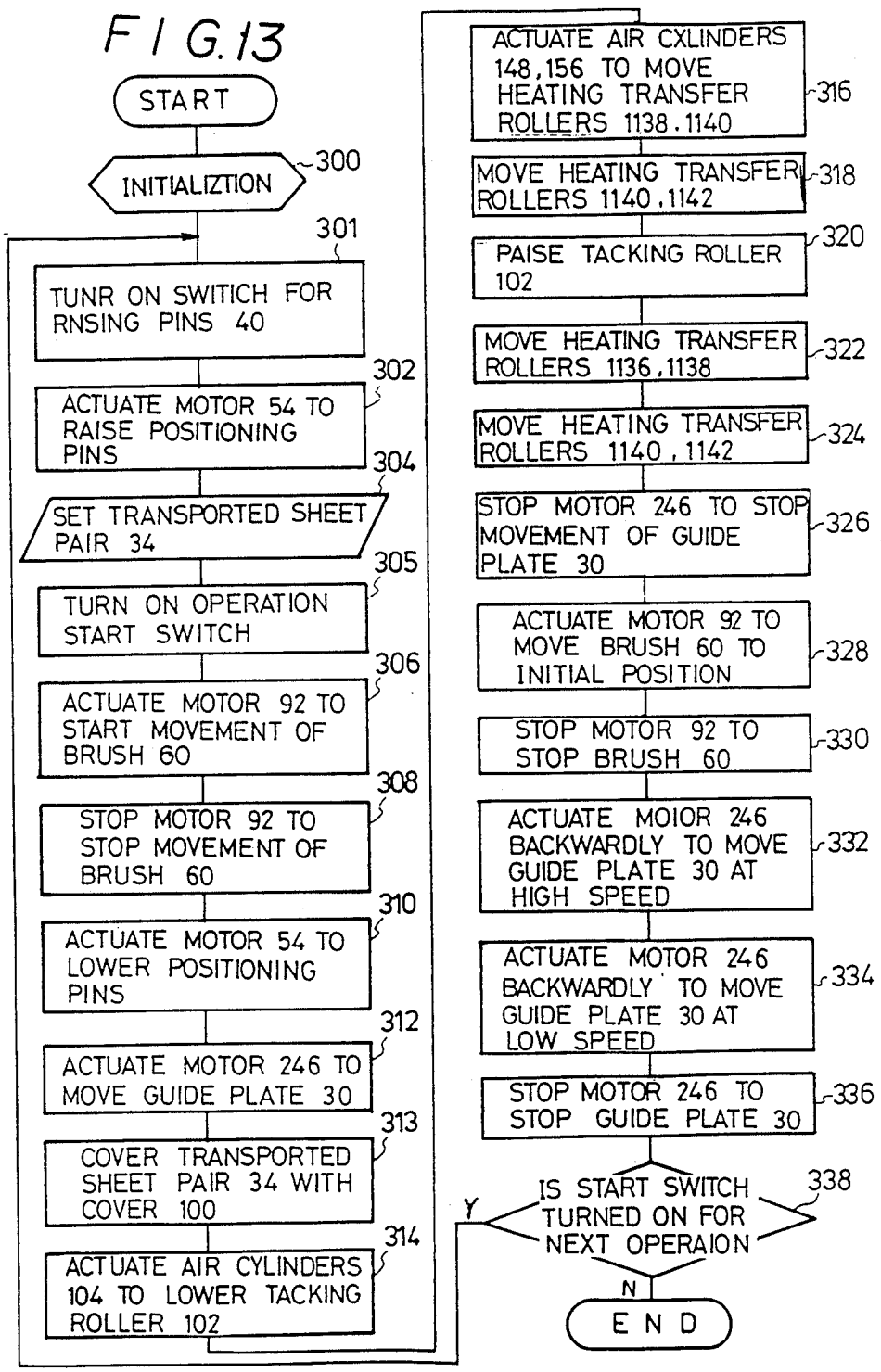
FIG. 13 is a flowchart showing operation of the image transfer apparatus of the second embodiment.

Next, operation of the second embodiment will be described with reference to a flowchart of FIG. 13.

The following description of operation of this embodiment is limited to only the steps different from those in the first embodiment.

This embodiment is different from the first embodiment in the process between the step 316 and the step 326.

More specifically, the air cylinders 148, 156 are actuated to lower the heating transfer roller 1136 and raise the heating transfer roller 1138 in the step 316. This closes the travel path of the transported sheet pair 34. The transported sheet pair 34 is forwarded into a nip between the heating transfer rollers 1136, 1138. In a step 318, the air cylinders 148, 156 on the downstream side arc actuated to move the heating transfer rollers 1140, 1142 for closing the travel path of the transported sheet pair 34. The transported sheet pair 34 fed out of the heating transfer rollers 1136, 1138 is forwarded into a nip between the heating transfer rollers 1140, 1142. Thus, the transported sheet pair 34 is advanced and heated while held between the heating transfer rollers 1136, 1138 and between the heating trasfer rollers 1140, 1142 under pressure, so that image transfer is performed during the advancement.

Because the outer diameter of the heating transfer roller 1142 is set to be not smaller than that of the heating transfer roller 1138, the heating transfer roller 1142 has a higher outer circumferential speed. Further, the motor 162 or the torque transmission device associated therewith is so set that the heating transfer rollers 1136, 1143 positioned above the travel path of the transported sheet pair 34 have an outer circumferential speed equal to or lower than that of the heating transfer roller 1142 positioned under the travel path. Therefore, with the transported sheet pair 34 becoming held between the heatingtransfer rollers 1140, 1142 while it is still being held between the heating transfer rollers 1136, 1138, the transported sheet pair 34 can travel in a horizontal attitude free of any slack, or in a slightly tensioned condition. In case of rather strong tension, however, the one-way clutches 143, 143A, 145 are brought into action such that no torque is transmitted to the heating transfer rollers 1136, 1138, 1140 and the heating transfer rollers 1136, 1138, 1140 are hence rotated at the same outer circumferential speed as that of the heating transfer rollers 1142 through the transported sheet pair 34; i.e., the respective outer circumferential speeds are synchronized with one another. Also, in the drive system 202 for feeding the transported sheet pair 202, the drive system 202 is synchronized with the heating transfer rollers 1142 with action of the one-way clutch 252. As a result, there occurs no shift in position between the image sheet 26 and the image-receiving sheet 28.

After the transported sheet pair 34 has passed the tacking station 20, the tacking roller 102 is raised again in a step 320. In subsequent steps 322, 324, the heating transfer rollers 136, 138 and the heating transfer rollers 1140, 1142 are so moved as to open the travel path of the transported sheet pair 34.

In this connection, the transported sheet pair 34 is advanced by the motor 246 to the transfer station 22, but threrafter advanced by the motor 178. In other words, the speed at which the transported sheet pair 34 is advanced by drive power of the motor 178 is set higher than that by drive power of the motor 246, and the motor 246 is coupled to the shaft 206 through the one-way clutch 254, whereby the transported sheet pair 34 is advanced by the motor 178 employed for driving the the heating transfer rollers 1136, 1138, 1140, 1142 during image transfer under heating.

At the point when the transported sheet pair 34 is completely fed out of the transfer station 22, the motor 246 is topeed in operation ot stop movement of the guide plate 30 in a step 326. At this time, the transported sheet pair 34 is already advanced to the cooling station 24 where the transported sheet pair 34, which has been heated up to a higher temperature in the transfer station 22, is cooled.

The remaining steps are the same as those in the first embodiment and hence their description is omitted.

Next, a third embodiment of the present invention will be described with reference to FIGS. 14 and 15.

In these figures, the same members and components in this embodiment as those in the above first and second embodiments are denoted by the same reference numerals, and their description is omitted here.

Figure 14:
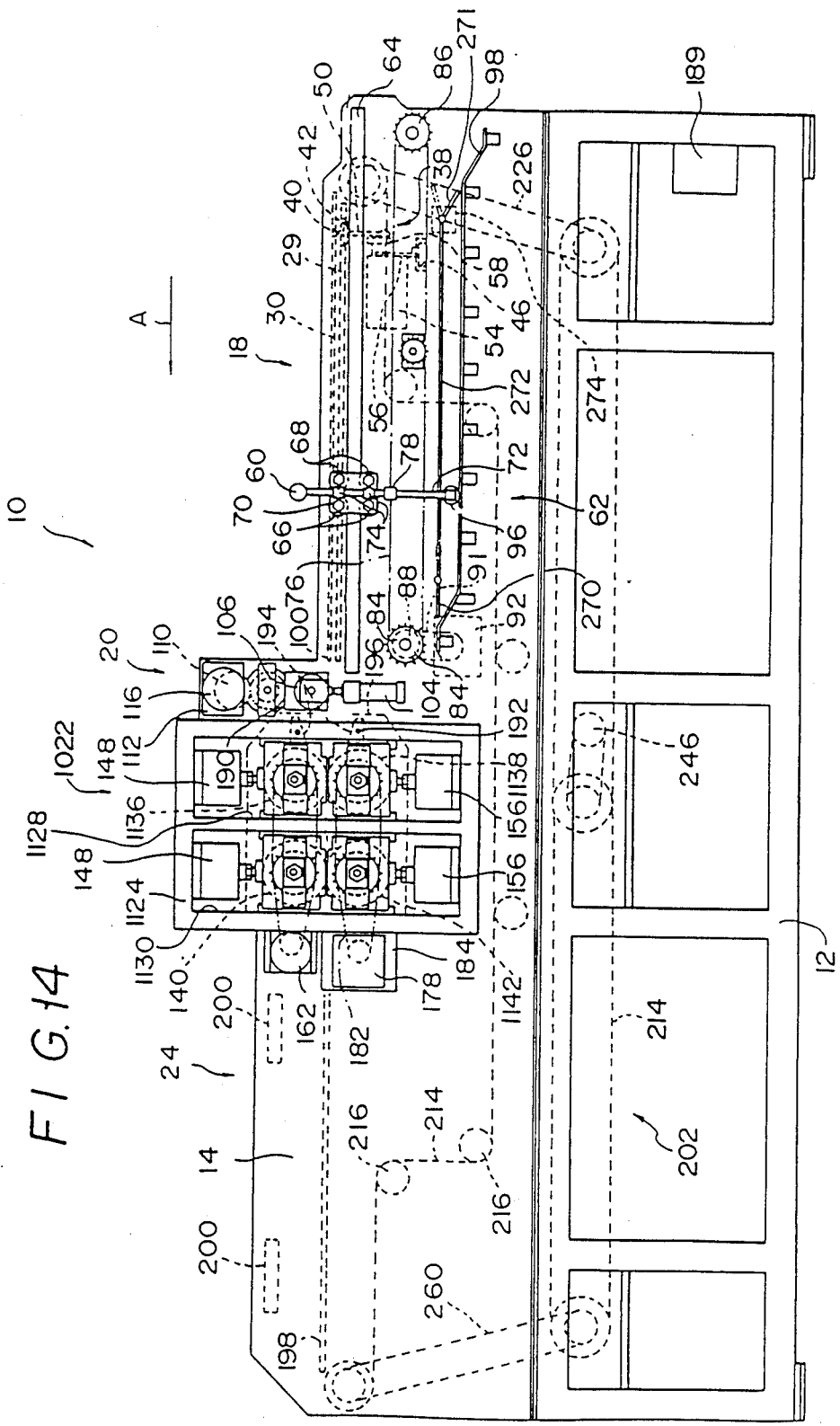
FIG. 14 is a side view showing a third embodiment.
Figure 15:
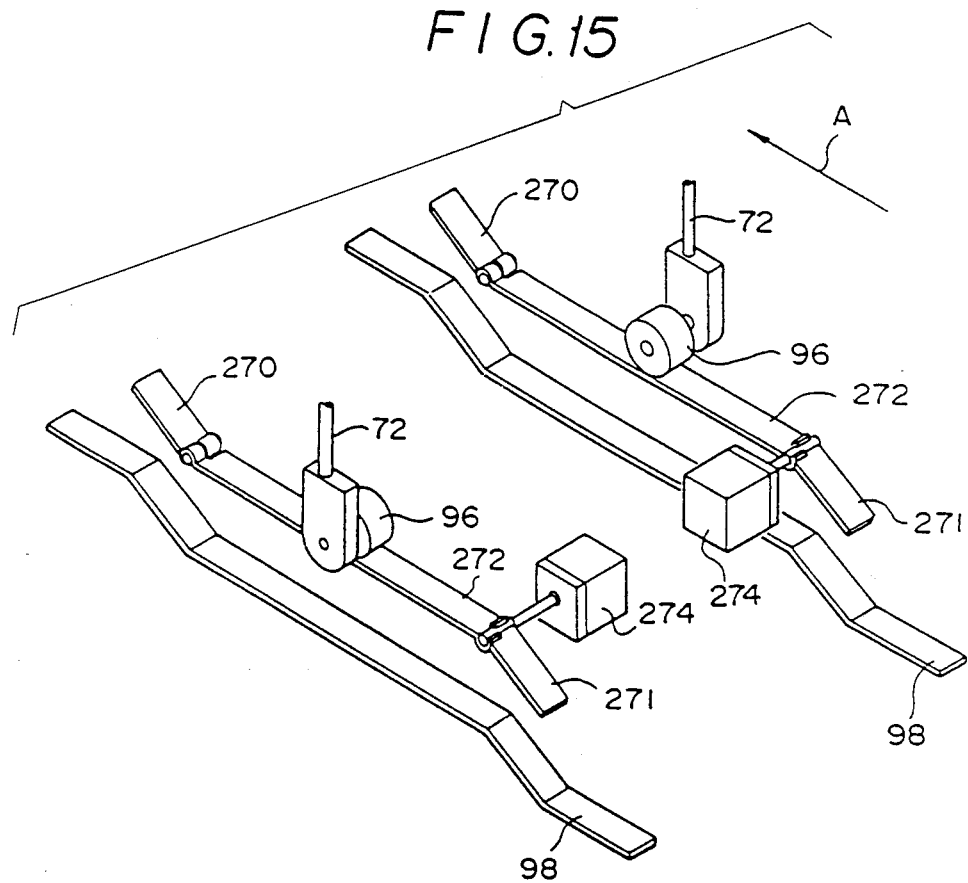
FIG. 15 is a perspective view showing a relationship between guide plates and return guide plates of the second embodiment.

Above each of paired guide plates 98, as shown in FIGS. 14 and 15, there are disposed guide path changing plates 270, 271 and a return guide plate 272. The return guide plate 272 is located corresponding to an intermediate portion of the guide plate 98, and the guide path changing plates 270, 271 are located to extend from the opposite ends of the return guide plate 272 outwardly.

The guide path changing plate 271 located upstream of the return guide plate 272 in the travel direction of the transported sheet pair 34 (i.e., on the side from which the transported sheet pair 34 is to be inserted) is, as shown in FIG. 14, arranged in such a manner as being continuously adjoined to an inclined portion of the guide plate 98 in its stepped end.

The guide path changing plates 271 are each coupled to the return guide plate 272 pivotably about the end of the return guide plate 272, and they are rotatively driven upon energization of a pair of actuators 274 such as rotatary solenoids, for example.

When the brush 60 is moved in the direction of travel (as indicated by arrow A in FIG. 14) of the transported sheet pair 34, the actuators 274 are energized to turn the guide path changing plates 271 upwardly counterclockwise so that the guide path changing plates 271 are brought into an upturned position (indicated by imaginary lines). When the brush 60 is moved in the opposite direction (i.e., in a direction opposite to arrow A in FIG. 14), the actuators 274 are not energized and the guide path changing plates 271 remain in a normal downward position (indicated by solid lines).

Furthermore, the guide path changing plate 270 located downstream of the return guide plate 272 in the travel direction of the transported sheet pair 34 is arranged in such a manner as abutting at its distal end with the upwardly stepped portion of the guide plate 98 on that side. The guide path changing plate 270 is normally in a position indicated by solid lines in FIG. 14, and can be pivoted upwardly upon the guide roller 96 striking against it when the brush 60 is moved in the direction of travel of the transported sheet pair 34. When the brush 60 is moved in the opposite direction (i.e., in a direction opposite to arrow A in FIG. 14), the guide path changing plates 270 are turned downwardly by the plate's own weight to close the paths led to the guide plates, allowing the brush 60 to pass over the return gides 272.

Therefore, the path along which the brush 60 is moved in the direction of travel of the transported sheet pair 34 is different from the path along which it is returned to an initial position. Thus, during the return stroke, the brush 60 is moved above apart from the surface of the transproted sheet pair 34 while being guided by the return guide plates 272.

This allows to set the return timing of the brush 60 simultaneously with starting to feed the transported sheet pair 34 toward the tacking station. Further, because of the brush 60 moving away from the transported sheet pair 3j during the return stroke, durability of the brush is improved.

In addition, since the brush 60 is automatically moved in the direction of travel of the transported sheet pair 34, it becomes possible to uniformly rub the surface of the transported sheet pair 34. Accordingly, static electricity charged on the surface of the transported sheet pair 34 can be removed uniformly.

While, in the first and second embodiments, the brush 60 is returned to its intitial position (i.e., the side from which the transported sheet pair 34 is to be inserted) during cooling of the transported sheet pair 34, the brush 60 may be returned at any time after the transported sheet pair 34 has passed the tacking station in the second embodiment. On this occasion, the brush 60 will never rub over the working table 29 because it runs along the different return path.

The foregoing embodiments have been described as transferring an image in the transfer station by heating the transported sheet assembly under pressure. But, the present invention is also applicable to the case that the transported sheet assembly is subjected to pressure alone for image transfer.

FOURTH EMBODIMENT

Figure 16:
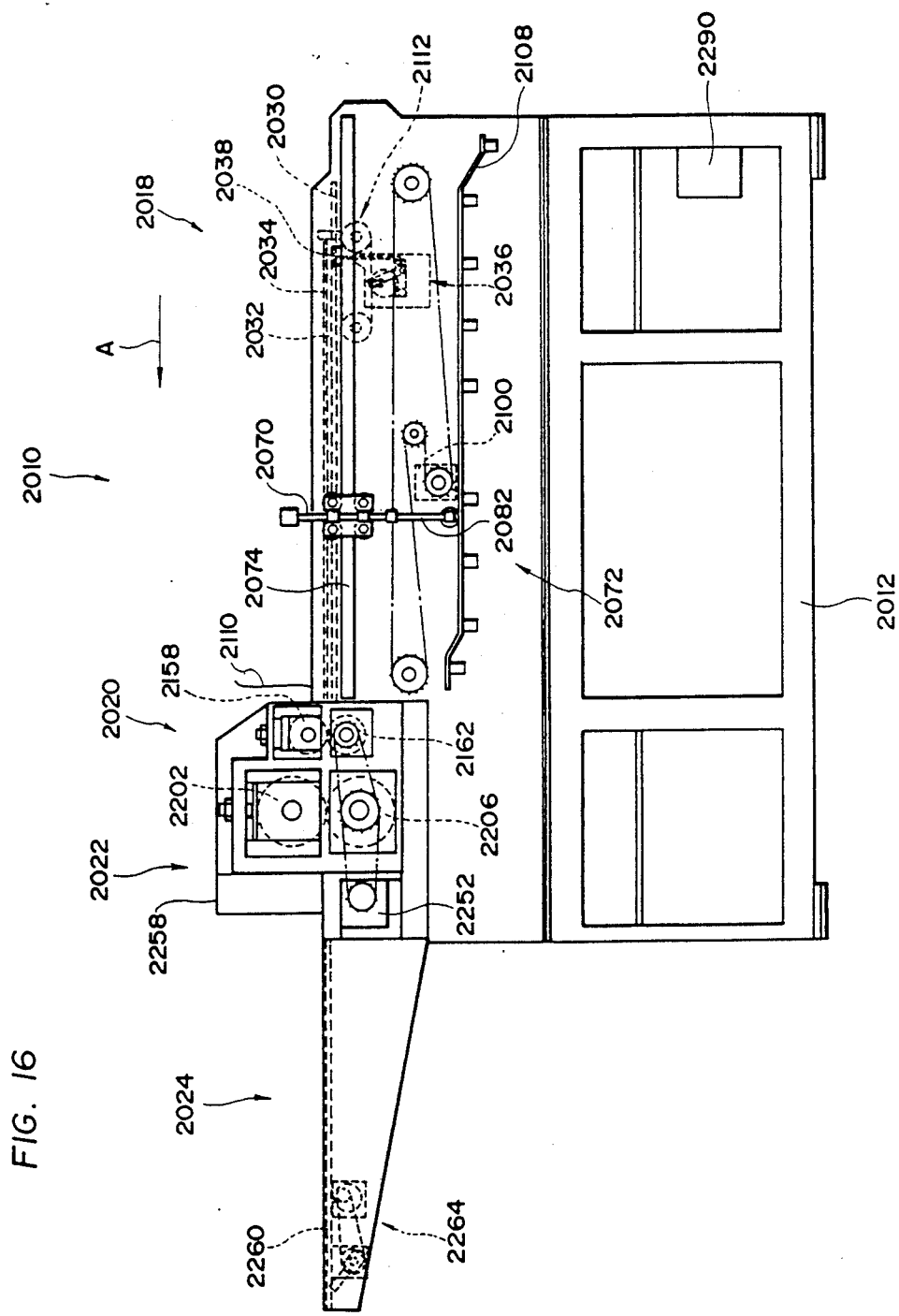
FIG. 16 is a side view showing a fourth embodiment of an image transfer apparatus in which the present invention is incorporated.

FIG. 16 illustrates a fourth embodiment of an image transfer apparatus 2010 to which an image transfer method in accordance with the present invention is applied. Specifically, FIG. 16 is a left-hand side sectional view showing schematic construction of hte image transfer apparatus 2010, and FIG. 17 is an exploded perspective view of the image transfer apparatus 2010.

<IMAGE TRANSFER APPARATUS>

Figure 17:
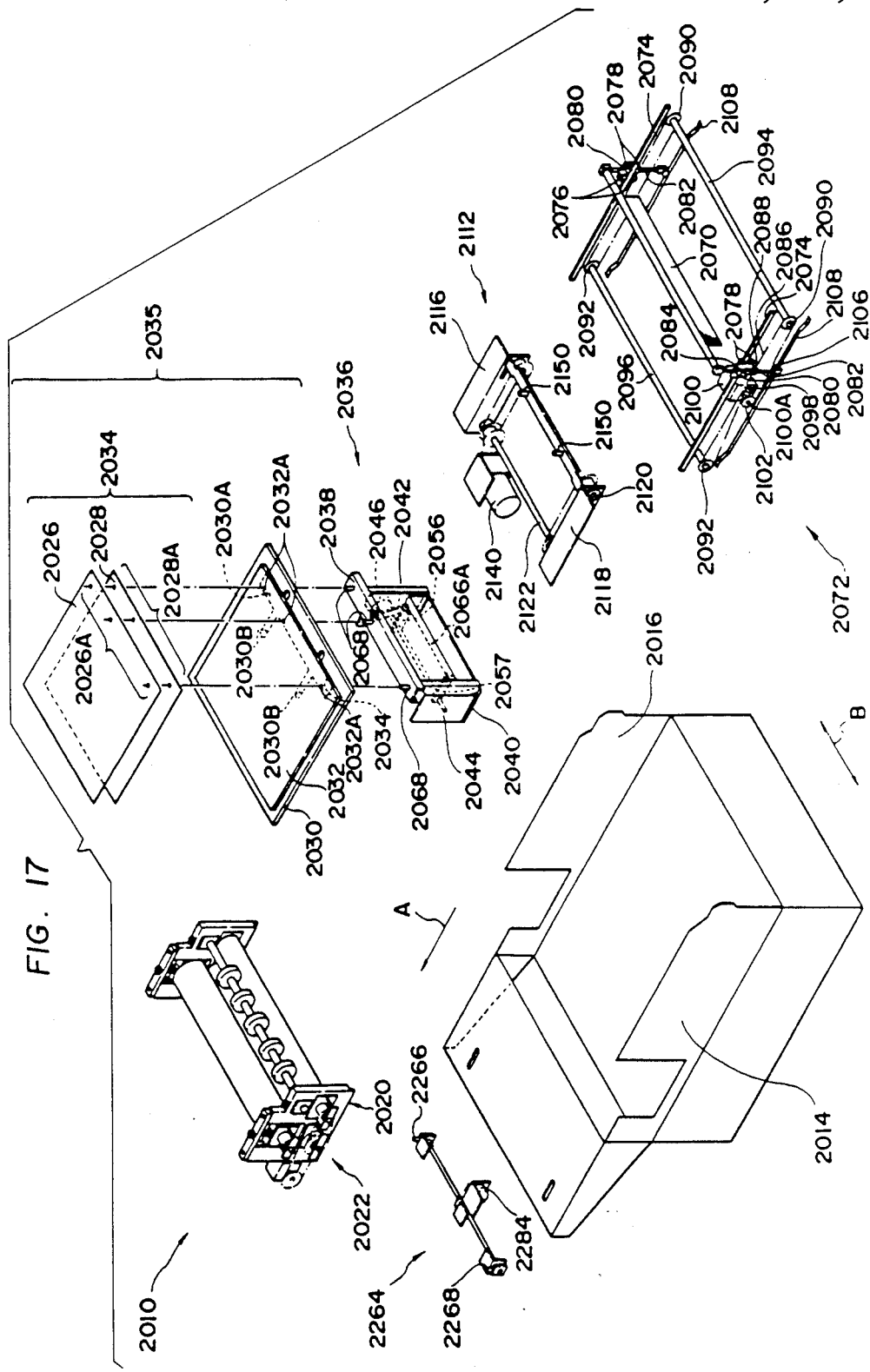
FIG. 17 is an exploded perspective view showing the image transfer apparatus of the fourth embodiment.

As shown in FIGS. 16 and 17, the image transfer apparatus 2010 has a pair of side plates 2014, 2016 vertically disposed on a machine base 2012, and includes a working station 2018, tacking station 2020, transfer station 2022 and cooling station 2024 successively disposed in the lengthwise direction of the machine base 2012. An image sheet 2026 having an image printed thereon and and image-receiving sheet 2028 are placed one above the other and transported through the working station 2018, tacking station 2000, transfer station 2022 and cooling station 2024, so that the image on the image sheet 2026 is transferred to the image-receiving sheet 2028.

<WORKING STATION>

The working station 2018 includes a working table 2030 disposed between the side plates 2014 and 2016. The working table 2030 is supported on both sides to the side plates 2014, 1016, and has a guide plate 2032 rested on the upper surface thereof. The image-receiving sheet 2028 and the image sheet 2026 are placed in this order on the guide plate 2032 one above the other, i.e., in superposed relation.

The working table 2030 is formed in its upstream side in the direction of advancement with a rectangular opening 2034 extending the widthwise direction (indicated by arrow B) of the image transfer apparatus 2010. A flat bar 2038 vertically movable by a positioning mechanism 2036 is inserted in the opening 2034.

<POSITIONING MECHANISM

Figure 18:
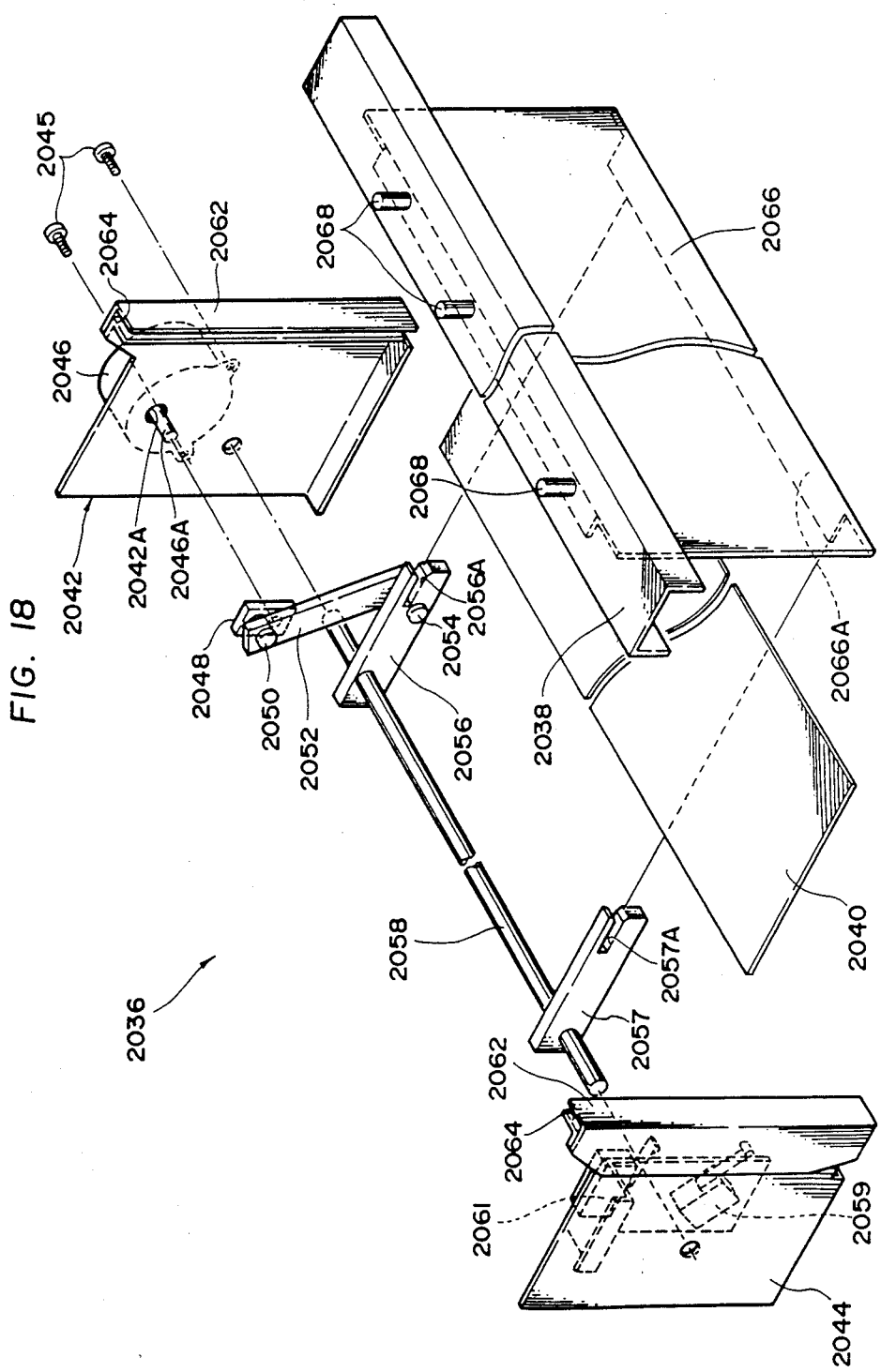
FIG. 18 is an exploded perspective view showing a positioning mechanism of the fourth embodiment.
Figure 19:
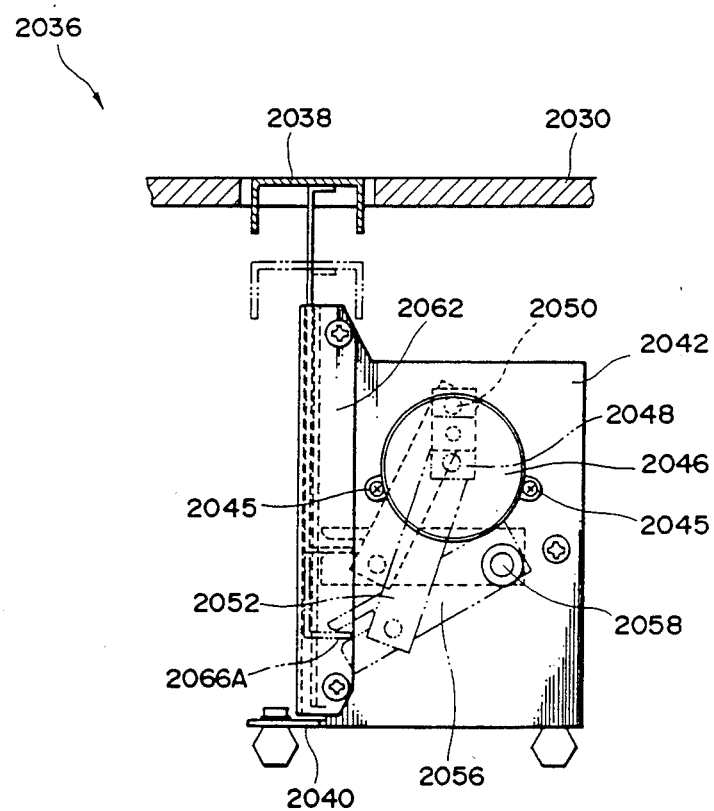
FIG. 19 is a side view showing the positioning mechanism.

As shown in FIG. 17, the positioning mechanism 2036 is disposed under the working table 2030. As shown in FIG. 18, the positioning mechanism 2036 has a pair of side plates 2042, 2044 provided vertically on a base 2040. One side of each of these side plates 2042, 2044 is bent in the direction of facing each other, and a slide portion 2064 is formed between the same and a bracket 2062 secured to each of the side plates 2042, 2044. Inserted in this slide portion 2064 is a slide plate 2066 connected to a lower portion of a flat bar 2038. The vertical movement of this slide plate 2066 causes the flat bar 2038 to move into or out of a rectangular through hole 2030A provided in the working table 2030.

A motor 2046 is attached to the outer side of the side plate 2042 by means of screws 2045. A drive shaft 2046A of the motor 2046 extends through a through hole 2042A provided in the side plate 2042, projecting into the space between the side plates 2042, 2044.

One end of an arm 2040 is secured to a distal end of the drive shaft 2046A. One end of a pin 2050 is rotatably supported by the other end of the arm 2048. One end of a connecting arm 2052 is rotatably supported by the other end of the pin 2050. One end of a pin 2054 is rotatably supported by the other end of the connecting arm 2052, while the other end of the pin 2054 is rotatably supported by an intermediate portion of a driving arm 2056. The other end of the driving arm 2056 is rotatably supported by a support shaft 2058 extending between the side plates 2042, 2044. A slit 2056A is formed on the other end side of the driving arm 2056. A lower bent portion 2066A of the slide plate 2066 is inserted in this slit 2056A.

In addition, a driving arm 2057 having the same configuration as the driving arm 2056 is supported by an intermediate portion of the support shaft 2058. A slit 2057A is formed at the other end of this driving arm 2057, and the lower bent portion 2066A is inserted therein.

Accordingly, when the drive shaft 2046A rotates, the arm 2048 in turn rotates, and the connecting arm 2052 swings. As the connecting arm 2052 swings, the driving arms 2056, 20km rotate with the support shaft 2058 as a center, causing the slide plate 2066 to move vertically. In addition, a plurality of positioning pins 2068 are provided vertically on the flat bar 2038. The spacing between the adjacent two of the positioning pins 2068 is set corresponding to that of rectangular through holes 2032A formed in the guide plate 2032 for positioning on the working table 2030 a transported sheet pair 2060 in which the image sheet 2026 and the image-receiving sheet 2028 are placed one above the other.

The positioning pins 2068 are arranged corresponding to positioning holes 2026A, 2028A bored through the image sheet 2026 and the image-receiving sheet 2028, respectively, for aligning (registering) the image sheet 2026 and the image-receiving sheet 2028 with each other.

In addition, limit switches 2059, 2061 are fixed to the side plate 2044. These limit switches 2059, 2061 abut against the driving arm 2057 for setting the raising position and lowering position of the flat bar 2038.

Above the working station 2018, there is disposed a brush 70 extending along the widthwise direction (indicated by arrow B) of the working table 2029. The brush 70 can be moved by a brush drive mechanism 2072 in the direction of travel (indicated by arrow A) of the transported sheet pair 2060.

<BRUSH DRIVE MECHANSIM>

The brush drive mechansim 2072 has a pair of guide rails 2074 positioned on the outside of and attached to the side plates 2014, 2016. On either side, a pair of guide rollers 2076 and a pair of guide rollers 2078 are disposed to hold one of guide rails 2074 therebetween from above and beneath. These two pairs of guide rollers 2076 and guide rollers 2078 are fixed to a movable plate 2080, whereby the movable plate 2080 is guided in the lengthwise direction (indicated by arrow A) of the guide rail 2074.

A thrust shaft 2082 vertically disposed has its intermediate portion coupled to each movable plate 20 through slide bearings 2084. This allows the thrust shaft 2082 to move in the direction of travel of the transported sheet pair 2060, as well as to move vertically.

The thrust shaft 2082 is coupled through a connecting bracket 2088 to a chain belt 2086 disposed to extend in the direction of travel of the transported sheet pair 2060. This coupling is made such that the thrust shaft 2082 can move vertically with respect to the connecting bracket 2088.

The chain belt 2086 is stretched between and around a pair of sprockets 2090, 2092. The pair of sprockets 2090, 2092 are fixed on either side to one ends of a pair of shafts 2094, 2096 extending between and carried by the side plates 2014, 1016. These sprockets 2092, 2094 are arranged outside the side plates 2014, 2016.

A sprocket 2098 is pivotally supported by the side plate 2014 between the sprockets 2090, 2092. In addition, a motor 2100 is supported by the side plate 2014 between the sprockets 2098, 2092 via an unillustrated bracket. A drive shaft 2100A of the motor 2100 projects outwardly of the side plate 2014. A sprocket 102 is secured to a distal end of the drive shaft 100A projecting outwardly of the side plate 2014. A chain belt 2104 is provided on the sprockets 2090, 2092, 2098, 2102. This arrangement permits the chain belt 2101 to be driven by the torque of the motor 100.

A pair of guide rollers 2106 is attached to respective lower ends of the pair of thrust shafts 2082, and rested on the upper surfaces of a pair of guide plates 2108. The guide plates 2108 are arranged to extend in the lengthwise direction of the side plates 2014, 2016 and fixed in place outside the side plates 2014, 1016. The guide plates 2108 are each bent into the stepped form on the side from which the transported sheet pair 2060 is to be inserted, such that the guide plate 2108 has its distal end located below an intermediate portion thereof. The guide plates 2108 are each also bent into the stepped form in its rear end, i.e., on the side near the tacking station 2020, such that the rear end is located above the intermediate portion of the guide plate 2108. Therefore, the brush 2070 is located below the intermediate portions of the guide plates 2108 for ease of the inserting operation by an operator, while the distal end of the brush 2070 is located above apart from the transported sheet pair 2060 on the side near the tacking station 2020.

As shown in FIG. 16, attached to the guide plate 2030 is one end of a cover sheet 2110 on the side near the tacking station 2020. This cover sheet 2110 covers the upper surface of the transported sheet pair 2060 so as to protect the transported sheet pair 2060. Also, the transporting sheet assembly 2035 is constituted by covering the transported sheet pair 2060 placed on the guide plate 2032 with the cover sheet 2110.

<FIRST INSERTING MECHANISM>

Figure 20:
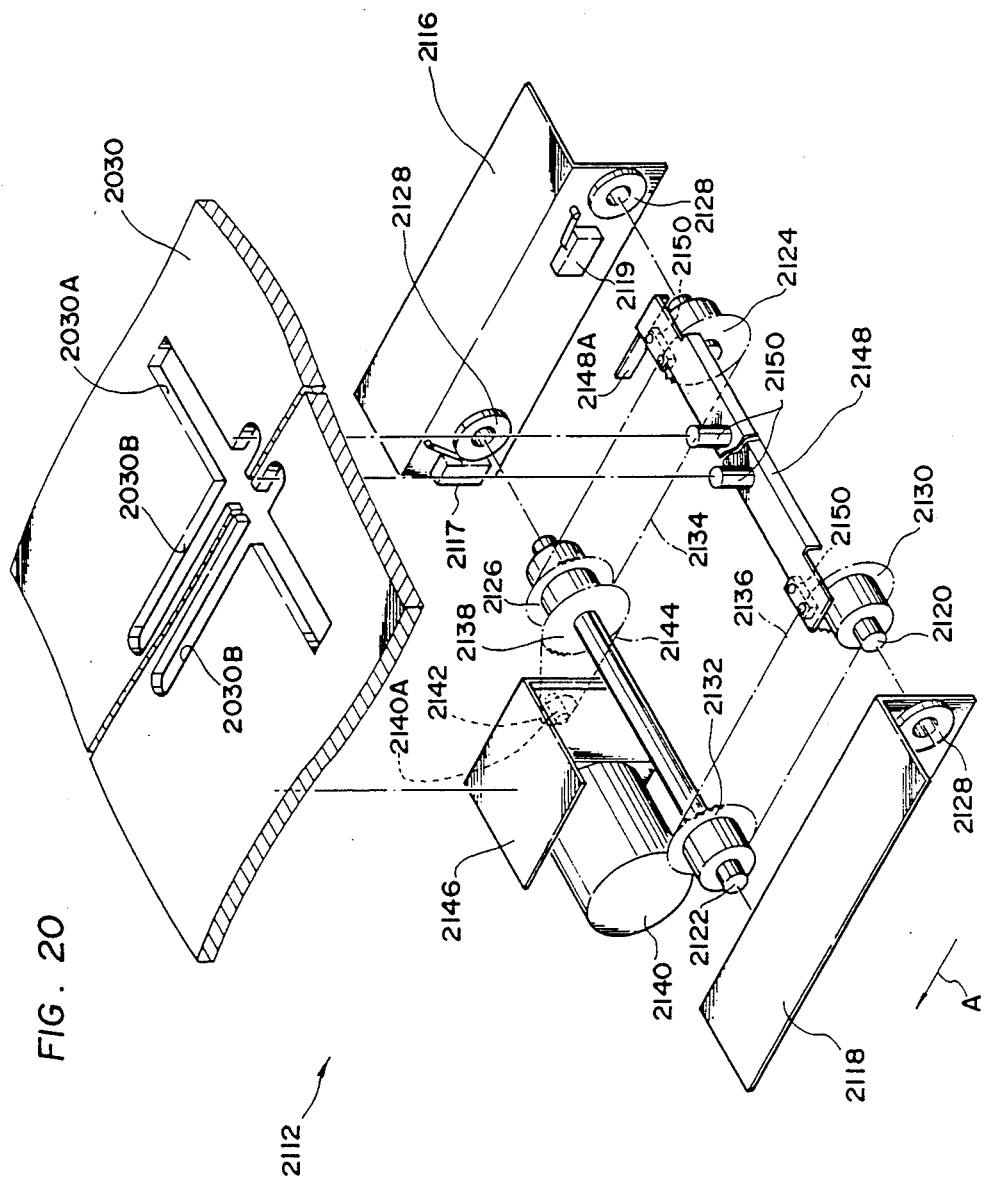
FIG. 20 is a perspective view showing a first inserting mechanism of the fourth embodiment.

A first inserting mechanism 2112, i.e., a first inserting means, is disposed on the underside of the working table 2030 of the working station 2018 on the side where the transported sheet pair 2060 enters. As shown in FIG. 20, a pair of side plates 2116, 2118 each having a L-shaped section are fixed to the underside of the working table 2030 in such a manner as to face each other. Two support shafts 2120, 2122 extend between and carried by the side plates 2116, 2118 via bearings 2128.

Sprockets 2124, 2126 are respectively secured to ends of the support shafts 2120, 2122 on the side of the side plate 2116. In addition, sprockets 2130, 2132 are respectively secured to the opposite ends of the support shafts 2120, 2122 on the side of the side plate 2118. An endless chain belt 2134 is stretched between and wound around the sprockets 2124, 2126. An endless chain belt 2136 is stretched between and wound around the sprockets 2130, 2132.

A sprocket 2138 is secured to the support shaft 2122 on the side of the sprocket 2126. An endless chain belt 2144 is stretched between and wound around the sprocket 2138 and a sprocket 2112 secured to a drive shaft 2140A of a motor 2140. The motor 2140 is fixed to the underside of the working table 3030 via an L-shaped bracket 2146. Accordingly, the endless chain belts 2134, 2136 are driven by the torque of the motor 2140.

An insertion plate 2148 is fixed to the endless chain belts 2134, 2136 via brackets 2150. Insertion pins 2150 are disposed vertically on the upper surface of the insertion plate 2148. Distal ends of these insertion pins 2150 respectively extend through a movement hole 2030A provided vertically in the working table 2030, and project from the upper surface of the working table 2030. These projecting distal ends serve to abut against a side of the transported sheet pair 2060.

This first inserting mechanism 2112 is adapted to insert the guide plate 2032 into the tacking station 2020 as the insertion pins 2150 move in the direction of arrow A in FIG. 5.

In addition, the side plate 2116 is provided with limit switches 2117, 2119. These limit switches 2117, 2119 are contacted by a contact portion 2148A provided on one end of the insertion plate 2148 in a projecting manner so as to set the moving position of the insertion plate 2148.

At the working station 2018, the guide plate 2032 with the image sheet and the image-receiving sheet superposed thereon (this assembly being hereinafter referred to as the transporting sheet 2035) is sent toward the tacking station 2020.

<TACKING STATION>

Figure 21:
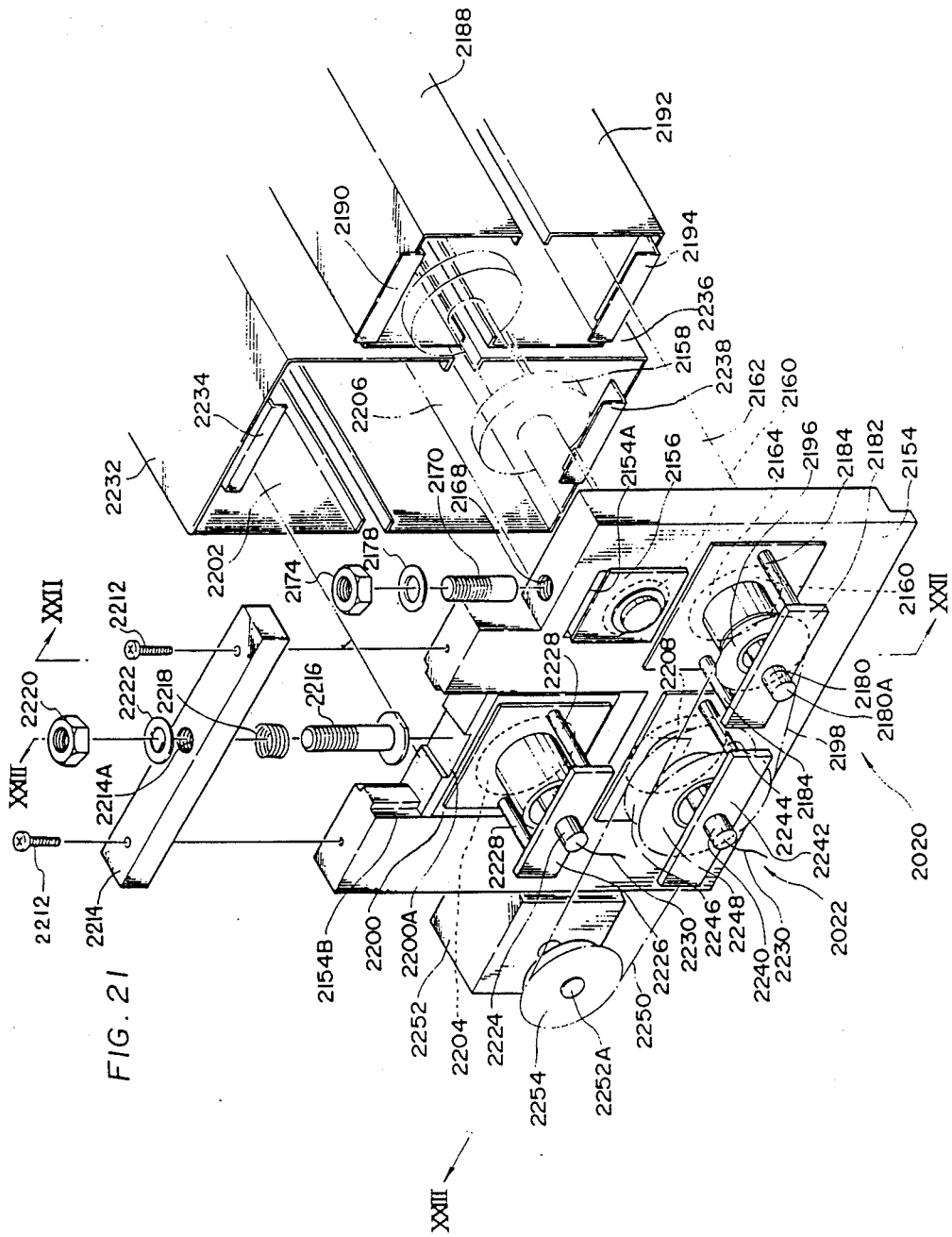
FIG. 21 is a perspective view showing the support structure of a tacking roller and heating transfer rollers of the fourth embodiment.
Figure 23:
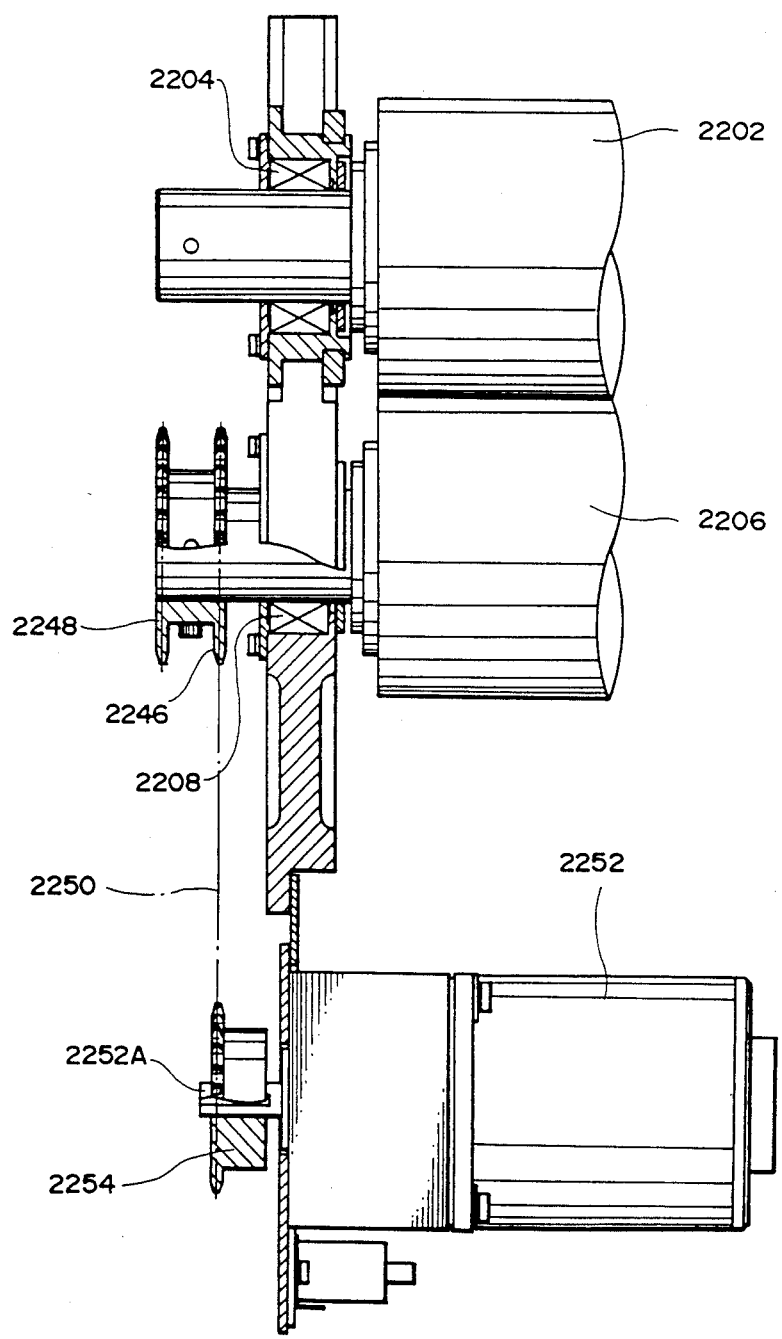
FIG. 23 is a sectional view taken along line VIII—VIII in FIG. 21.

As shown in FIG. 17, openings 2152 are formed in portions of the side plates 2014, 1016 corresponding to the tacking station 2020 and the transfer station 2022 adjacent to the tacking station 2020. As shown in FIG. 21, a pair of housing plates 2154 are respectively fitted in those openings 2152. A rectangular opening 2154A is formed in an upper portion of the housing plate 2154 corresponding to the tacking station 2020. A housing 2156 is inserted in this rectangular opening 2154A. In the housing 2156, a skewer type tacking roller 2158 extends between the housing plates 2154 and supported thereto via bearings 2160. In addition, a roller 2162 disposed in abutting relation with the tacking roller 2158 and adapted to support the same is supported by a bearing 2164. The transporting sheet 2035 is inserted into a nip between the tacking roller 2158 and the roller 2162, and is tacked by the skewer-type roller 2158.

The widthwise dimension of the housing 2156 to which the tacking roller 2158 is supported is identical with the widthwise dimension of the rectangular opening 2154A, and the longitudinal length thereof is set to be shorter than the depthwise length of the rectangular opening 2154A. For this reason, the housing 2156 is movable vertically within the opening 2154A. Formed in an upper end portion of the housing 2156 is a rectangular opening 2156A, into which a stopper plate 2172 is inserted to restrict the rotation of the stopper plate 2172.

In addition, a through hole 2168 is formed in an upper wall portion above the rectangular opening 2154A, and a spring plunger (or ball plunger) 2170 is threadingly engaged with the through hole 2168. A distal end of the spring plunger 2170 extending through the through hole 2168 and projecting into the rectangular opening 2154A abuts against an upper portion of the housing 2156. As the spring plunger 2170 is tightened, the housing 2156 is urged downwardly. The position of a lower portion of the housing 2156 in the rectangular opening 2154A is set as the tacking roller 2158 is placed on the roller 2162.

In addition, a thread is formed on the head of the spring plunger 2170 projecting from above the housing plate 2154, and a nut 2176 is threadingly engaged therewith. A washer 178 is interposed between the nut 2174 applied only for prevention of looseness and the housing plate 2154.

Accordingly, as the nut 2176 is tightened, the housing 2156 moves downwardly, causing the tacking roller 2158 to approach the roller 2162, but at an initial stage the tacking roller 2158 is maintained in no pressurizing condition, i.e., the roller 2162 is pressurized by only the weight of the tacking roller 2158. In this condition, when the transporting sheet 2055 is inserted between the tacking roller 2158 and the roller 2162, it is pressurized from the upper and lower directions by the tacking roller 2158 and the roller 2162.

The roller 2162 has a hollow configuration, and a bar heater 2180 is inserted therein. The opposite ends of the bar heater 2180 project from the opposite ends of the tacking roller 2158, and are supported to a support plate 2182. The support plate 2182 is fixed to the housing plate 2154 via stays 2184. Connected to a terminal of the bar heater 2180 is one end of a lead wire 2180A in turn connected to an unillustrated power supply. As the bar heater 2180 is energized, the roller 2162 is heated, and the tacking roller 2158 is heated.

In addition, an axially upper portion of the tacking roller 2158 is covered with a cover 2188. This cover 2188 is secured to the housing 2156 via a substantially L-shaped attachment bracket 190. The cover 2188 has a U-shaped section the lower side of which is open, and a part of the outer periphery of the tacking roller 2158 accommodated therein projects out of the opening and abuts against the roller 2162 disposed below the tacking roller 2158.

The roller 2162 is covered with a cover 2192 having the same configuration as the cover 2188. The cover 2192 is arranged such that a part of the outer periphery of the roller 2162 projects outwardly through its opening which is open upwardly, and abuts against the tacking roller 2158. The cover 2192 is fixed to the housing plate 2154 via a bracket 2194 having a substantially L-shaped section. The covers 2188, 2192 serve to prevent drops in the temperature of the tacking roller 2158 and the roller 2162.

Between the housing plate 2154 and the support plate 2182, a sprocket 2196 is secured to a distal end of the roller 2162. A chain belt 2198 is wound around the sprocket 2196. The sprocket 2196 is arranged such that the torque of a motor 2252 transmitted to a healing transfer roller (to be described later) is transmitted by the chain belt 2198 to rotate the roller forwardly or backwardly.

<TRANSFER STATION>

A rectangular opening 2151B is formed in an upper portion of each of the housing plates 2154 at a position corresponding to the transfer station 2022. A housing 2200 is inserted in the rectangular opening 2154B. In the housing 2200, a heating transfer roller 2202 interposed between the housing plates 2154 is supported by a bearing 2204. In addition, a heating transfer roller 2206, which is supported to the housing plate 2154 and abuts against the heating transfer roller 2202 to support the same, is supported by a bearing 2208 in a lower portion of the heating transfer roller 2202. The transporting sheet 2035 is inserted into a nip between the heating transfer rollers 2202, 2206, where the transporting sheet 2035 is pressurized and heated so that the image recorded on the image sheet 2026 is transferred to the image-receiving sheet 2028.

The widthwise dimension of the housing 2200 for supporting the heating transfer roller 2202 is identical with the widthwise dimension of the rectangular opening 2154B, and its longitudinal length is set to be shorter than the depthwise length of the rectangular opening 2154B. Accordingly, the housing 2200 is movable vertically inside the opening 2154B. Formed in an upper end portion of the housing 2200 is a rectangular opening 2200A, into which a stopper plate 2210 is inserted to restrict the rotation of the stopper plate 2210.

An upper portion of the rectangular opening 2154B is closed by a plate 2214 fixed to an upper surface of the housing plate 2154 by means of bolts 2212. The plate 2214 is provided with a through hole 2214A at an intermediate portion thereof, and spring plunger 2216 is inserted therethrough. A distal end of the spring plunger 2216 extending through the through hole 2214A and projecting into the rectangular opening 2154B abuts against an upper face of the stopper plate 2210. A compression coil spring 2218 is interposed between the stopper plate 2210 for the spring plunger 2216 and the plate 2214, and urges the housing 2200 downwardly. The position of the lower portion of the housing 2200 within the rectangular opening 2154A is set as the heating transfer roller 2202 is placed on the heating transfer roller 2206.

A threaded portion is formed at a head of the spring plunger 2216 projecting above the plate 2214, and a nut 2220 is threadingly engaged therewith. In addition, a washer 2222 is interposed between the nut 2220 and the plate 2214.

Accordingly, as the nut 2220 is tightened against the urging force of the compression coil spring 2218, a pushing plate 2200A moves upwardly, so that the heating transfer roller 2202 is made to readily escape upwardly when the transporting sheet assembly 2035 passes between the heating transfer rollers 2202 and 2206, and the pressurizing force acting on the transporting sheet assembly 2035 by the heating transfer rollers 2202, 2206 becomes weak. On the other hand, as the nut 220 is loosened, the pushing plate 2200A moves downwardly, so that the upward escape amount of the heating transfer roller 2202 occurring when the transporting sheet assembly 2035 passes between the heating transfer rollers 2202 and 2206 is reduced, and the pressurizing force acting on the transporting sheet assembly 2035 by the heating transfer roller 2202 and the heating transfer roller 2206 becomes strong.

The heating transfer roller 2202 has a hollow interior, a bar heater 2224 being inserted therein. The opposite ends of the bar heater 2224 projected from the opposite ends of the heating transfer roller 2202, and supported by a support plate 2226. Connected to a terminal of the bar heater 2224 is one end of a lead wire 2230 in turn connected to an unillustrated power supply. Hence, the bar heater is energized and heated.

In addition, the heating transfer roller 2206 has the same hollow interior as the heating transfer roller 2202, a bar heater 2240 being inserted therein. The opposite ends of the bar heater 2240 project from the opposite ends of the heating transfer roller 2206, and are supported by support plates 2242, respectively. The support plate 2242 is secured to the housing plate 2154 via stays 244.

An axially upward portion of the heating transfer roller 2202 is covered with a cover 2232. This cover 2232 is fixed to the housing 2200 via a substantially L-shaped bracket 2234. The cover 2234 has a substantially U-shaped section the lower side of which is open, and a part of the outer periphery of the heating transfer roller 2202 accommodated therein projects outwardly from the opening and abuts against the heating transfer roller 2206 disposed below the heating transfer roller 2202.

In addition, the heating transfer roller 2206 is covered with a cover 2236 having the same configuration as the cover 2188. The cover 2236 is arranged such that a part of the outer periphery of the heating transfer roller 2206 projects from the opening which is open upwardly and abuts against the heating transfer roller 2202. The cover 2236 is fixed to the housing plate 2154 via a bracket 2238 having a substantially L-shaped section. The covers 2232, 2236 serve to prevent drops in the temperature of the heating transfer rollers 2202, 2206.

Between the housing plate 2154 and the plate 2224, sprockets 2246, 2248 are secured to a distal end of the heating transfer roller 2206. A chain belt 2250 is stretched between and wound around the sprocket 2246 and a sprocket 2254 secured to a drive shaft 2252A of the motor 2252. The motor 2252 is fixed to the side plate 2014 via a bracket 256.

Accordingly, the torque of the motor 2252 is transmitted via the chain belt 2250 and rotates the heating transfer roller 2206 forwardly or backwardly. When forward rotation is effected, the transporting sheet 2035 is transported from the working station 2018 to the receiving station 2024. On the other hand, in the case of backward rotation, the transporting sheet 2035 is transported from the receiving station to the tacking station 2020 and the working station 2018.

A chain belt 2198 wound around the sprocket 2196 fixed to the roller 2162 is wound around the sprocket 2248. As a result, the torque of the motor 2252 is transmitted to the roller 2162 so that the roller 2162 rotates.

The heating transfer rollers 2202, 2206 are provided with a cover 2258 via an unillustrated bracket so s to be shielded from the outside. This prevents heat of the heating transfer rollers 2202, 2206 from being dissipated to the outside.

<RECEIVING STATION>

Figure 24:
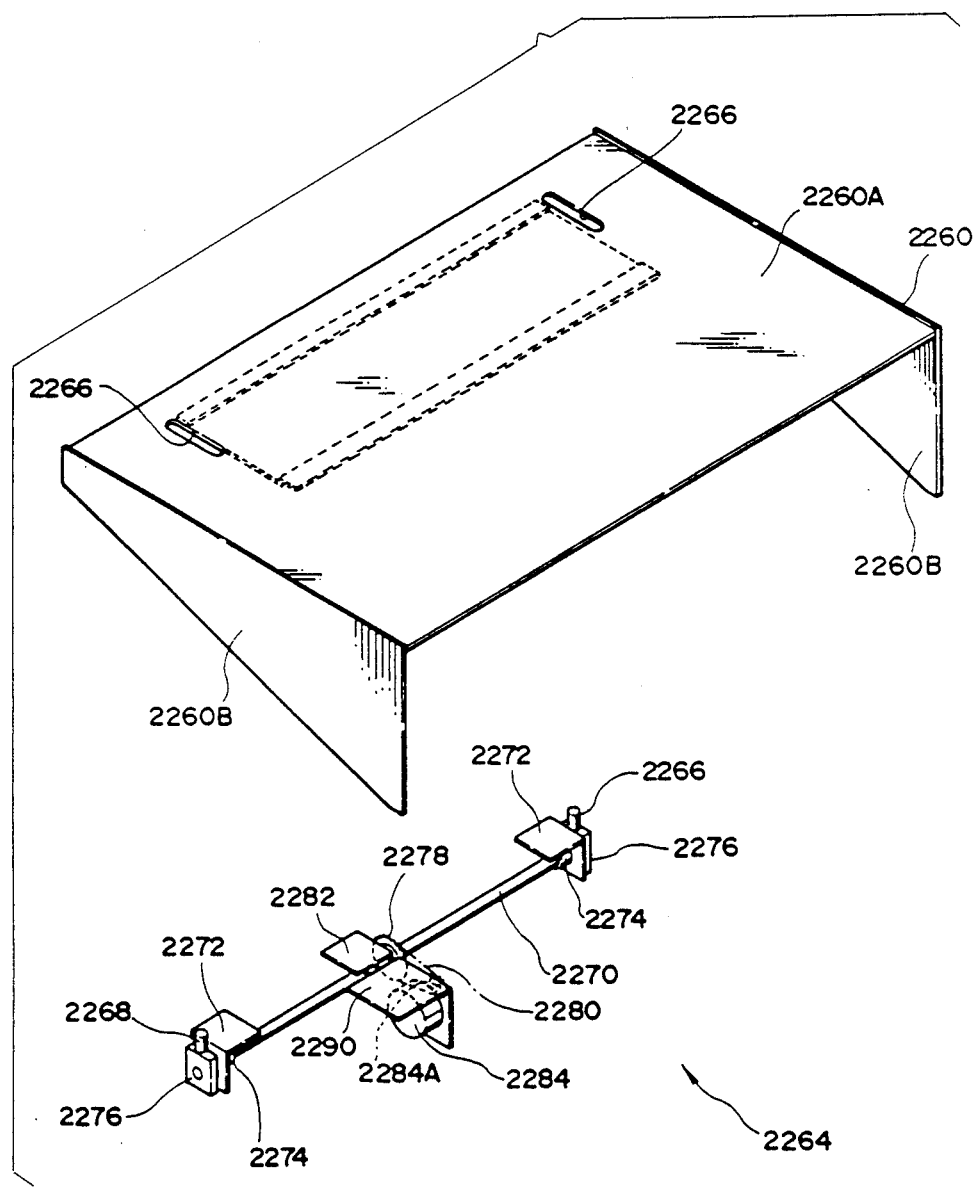
FIG. 24 is a perspective view showing a second inserting mechanism of the fourth embodiment.

A receiving table 2260 is disposed on the receiving station 2024. As shown in FIG. 24, this receiving table 2260 is arranged such that opposite sides of a flat portion 2260A are bent substantially orthogonally to serve as attaching potions 2260B for the side plates 2014, 2016. A pair of slits 2262 is formed in the flat portion 2260A in such a manner as to penetrate the obverse and reverse sides thereof. A pair of abutting pins 2266, 2268 of a second inserting mechanism 2264, i.e., a second inserting means, are respectively inserted in the slits 2262.

<SECOND INSERTING MECHANISM>

The second inserting mechanism 2264 is disposed on the underside of the receiving table 2260. Underneath the receiving table 2260, a support shaft 2270 is disposed along the widthwise direction of the receiving table 2260, and is rotatively supported via bearings 2274 to a pair of L-shaped brackets 2272 fixed to the underside of the receiving table 2260.

The opposite ends of the support shaft 2270 project outwardly of the brackets 2272, blocks 2276 being secured to their respective distal ends. Abutting pins 2266, 2268 are disposed vertically on these blocks 2276.

Th support shaft 2270 is supported by an L-shaped bracket 2282, a sprocket 2278 being secured in the vicinity of the bracket 2282. An endless belt 280 is stretched between and wound around the sprocket 2278 and a sprocket 2286 secured to a drive shaft 2284A of a motor 2284. The motor 2284 is fixed to an L-shaped bracket 2288 one end of which is secured to the underside of the receiving table 2260.

Accordingly, as the motor 2284 is actuated, the support shaft 2270 rotates, which in turn causes the blocks 2276 at the opposite ends thereof to rotate. As a result, the abutting pins 2266, 2268 swing, causing the transporting sheet 2035 on the receiving table 2260 to be inserted into a nip between the heating transfer rollers 2202, 2206 and moving to the lower side of the receiving table 2260 through the slits 2262.

<CONTROL APPARATUS>

Figure 25:
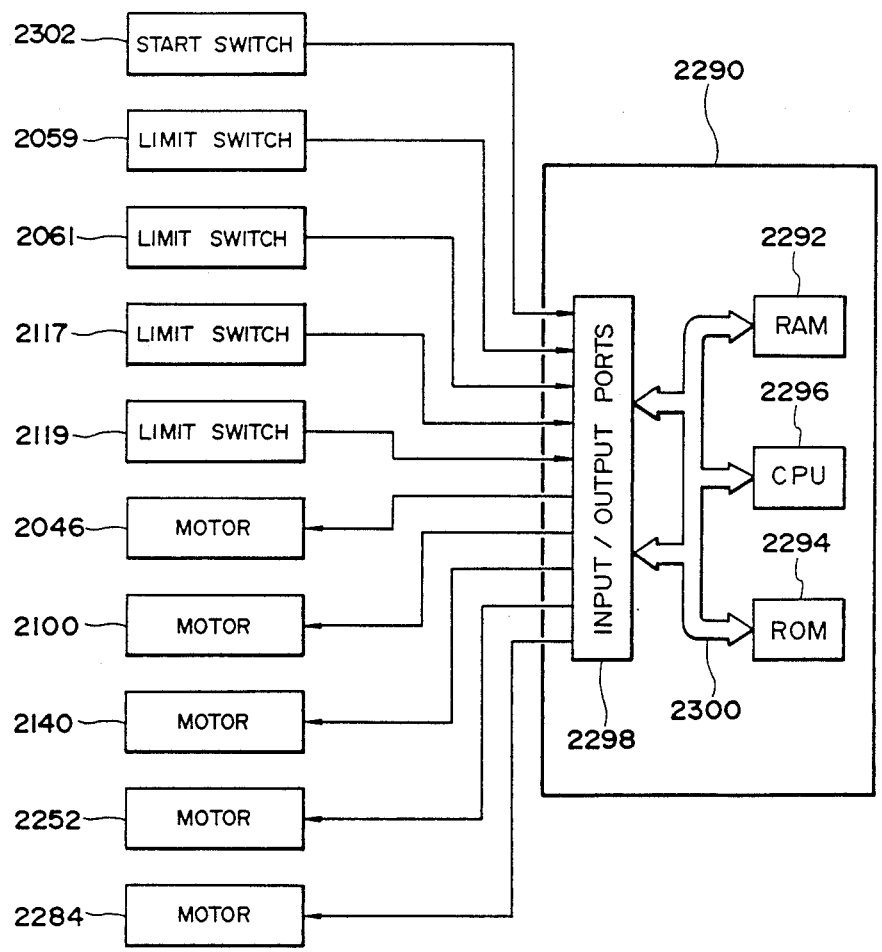
FIG. 25 is a control block diagram showing electrical connections between a control unit and other components.

The image transfer apparatus 22010 is provided with a control unit for controlling the operation of the image transfer apparatus 22010. A description will now be given of electrical connections between the control unit 2290 and various components with reference to a block diagram shown in FIG. 25. The control unit 2290 comprises a RAM 2292, a ROM 2294, a CPU 2296, and input/output ports 2298, which are connected to each other via a data bus 3300.

As shown in FIG. 24, a start switch 2302 and limit switches 2059, 2061, 2117, 2119 are connected to the input side of the input/output ports 2300. In addition, the motors 2246, 2100, 2140, 2252, 2284 are connected to the output side thereof.

Figure 26:
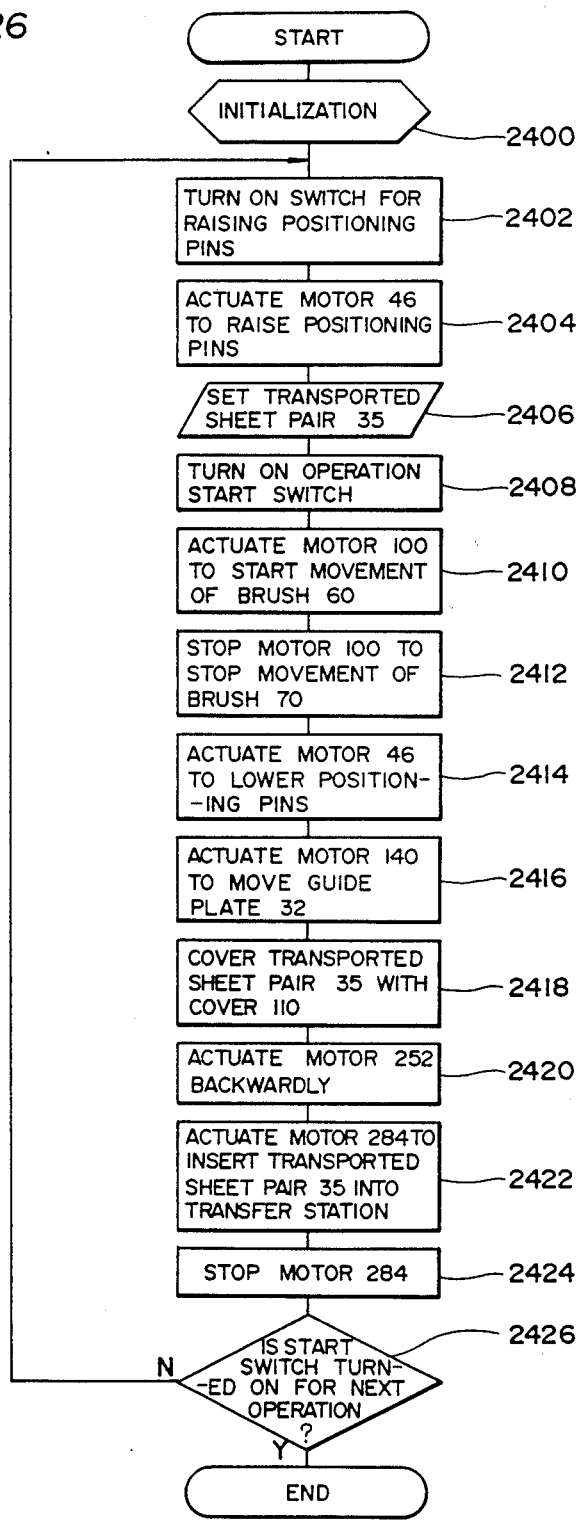
FIG. 26 is a flowchart showing operation of the image transfer apparatus of the fourth embodiment.

Referring now to a flowchart shown in FIG. 26, a description will be given of the operation of this embodiment.

When the image transfer apparatus 2010 is turned on by means of the start switch 2302, the initialization of the image transfer apparatus 2010 is executed in a step 400. The motor 2252 is actuated by this initialization, which in turn causes the heating transfer roller 2202 to rotate clockwise as viewed in FIG. 16 and causes the heating transfer roller 2106 to rotate clockwise as viewed in FIG. 16. The brush 2070 is located at a position closer to the insertion side.

Furthermore, the heaters 2180, 2224, 2240 inserted in the tacking roller 2158 and the heating transfer rollers 2202, 2206 are energized to heat the heating transfer rollers 2202, 2206 and the tacking roller 2158.

When the tempertures of the tacking roller 2158 and the heating transfer rollers 2202, 2206 have risen, requlated and reached a state permitting transfer, the start switch for raising the positioning pins 2068 is turned on (step 402).

In this state, in a step 404, the motor 2046 is actuated, and the flat bar 2038 as well as the positioning pins 2068 are raised. As a result, the flat bar 2038 is inserted into the rectangular opening 2030A formed in the working table 2030, and the positioning pins 2068 project through the through holes 2032A of the guide plate 2032 and above the guide plate 2032. The positioning holes 2026A of the image sheet 2026 are then received by positioning pins 2068 so as to be set on the image-receiving sheet 2028. In this case, the image sheet 2026 and the image-receiving sheet 2028 can be readily positioned by using the positioning pins 2068.

After the transporting sheet 2035 is set on the working table 2030 in a steo 406, the unillustrated start switch is turned on by the opertor in a step 408.

In a step 410, the motor 2100 is actuated, and the brush 2070 starts moving from the inserted side of the transporting sheet 2035 toward the other side thereof. As a result, air remaining between the image sheet 2026 and the image-receiving sheet 2028 is eliminated and the sheets 2026, 2028 are thus made flat.

When the brush 2070 moves to a positon immediately located before the tacking station 2020, the operation of the motor 2100 is stopped and the movement of the brush 2070 stops in a step 412.

Subsequently, in a step 414, the motor 2046 is actuated to lower the positioning pins 2068. As a result, the positioning pins 2068 come off the guide plate 2032. In a step 416, the motor 2140 is actuated, so that the guide plate 2032 moves the working table 2030 by the first inserting mechanism 2112 toward the tacking station 2020.

The transporting sheet 2035 inserted into a nip between the taking roller 2158 and the roller 2162 is transported in a clamped state and is inserted into a nip between the heating transfer rollers 2202, 2206 of the transfer station 2022 and is clamped thereby. The image sheet 2026 and the image-receiving sheet 228 are tacked to each other by the tacking roller 2158. Since the tacking roller 2158 is formed into the configuration of a skewer-type roller, a plurality of tacking positions are provided along the direction of travel of the transporting sheet assembly 2035. For this reason, air between the adjacent tacking positions is liable to be removed in the backward direction with respect to the direction of travel. This air is pushed out when the transporting sheet assembly 2035 is transported in a clamped state by the heating transfer rollers 2202, 2206 in an ensuing step 416, so that there is no occurrence of bubbles between the image sheet and the image receiving sheet during transfer.

In this case, in a step 418, the transporting sheet 2035 is covered with the cover 2110 as the transporting sheet 2035 is transported.

The image recorded on the image sheet 2026 is transferred to the image-receiving sheet 2028 by being subjected to pressurization and heating as the transporting sheet 2035 is transported in a clamped state by the heating transfer rollers 2202, 2206. The transporting sheet 2035 which has undergone transfer in the transfer station 2022 is sent to the receiving station 2024.

When the transporting sheet assembly 2035 is sent to the receiving station 2023, in a step 420, the motor 2252 is rotated backwardly, which in turn causes the heating transfer rollers 2202, 2206 rotate backwardly. In this state, the motor 2284 is actuated in a step 422. The actuation of the motor 2284 cause the abutting pins 2266, 2268 to move, so that the transporting sheet 2035 is inserted into a nip between the heating transfer rollers 2202, 2206.

Since the heating transfer rollers 2202, 2206 are rotating backwardly, the transporting sheet 2035 is again subjected to transfer while being clamped and transported by the heating transfer rollers 2202, 2206, and is inserted into a nip between the tacking roller 2158 and the roller 2162.

In a step 424, at the point when the transporting sheet 2035 is sent out from the tacking station 2020, the operation of the motor 2284 is stopped, so that the movement of the guide plate 2032 stops. At this juncture, the transporting sheet assembly 2035 is sent out to the working station 2018.

This completes transfer, and the cover sheet 2100 of the guide plate 2030 is tucked up and after the base layer of the image sheet 2026 is exfoliated from the image-receiving sheet 2028, the image-receiving sheet 2028 is removed from the guide plate 2030.

Then, in a step 426, the operator judges whether the process is to return to a series of steps starting with the step 402 or the operation is to be ended. In the case where the process is to return to the series of steps starting with the step 402, the ensuing steps are executed.

Thus, in this embodiment, the heating transfer rollers 2202, 2206 are driven, and the transporting sheet assembly 2035 is inserted into a nip between the heating transfer rollers 2202, 2206 by the first and second inserting mechanisms 2112, 2264. As a result, the transporting sheet assembly 2035 is automatically transported into the working station 2018, tacking station 2020, so that the tacking operation can be facilitated, and it is possible to facilitate the insertion of the guide plate with the image sheet 2026 and the image-receiver sheet 2028 superposed thereon into the transfer station 2022.

Furthermore, since the conventional working table for mounint the image sheet 2026 and the image-receiving sheet 2028 on the guide plate 2032 after being positioned becomes unnecessary, the space for installing the working table can be dispensed with, so that the working space can be reduced.

Moreover, in this embodiment, since the transporting sheet 2035 is transported from the working station 2018 to the receiving station 2024 via the tacking station 2020 and the transfer station 2022, and is then transported again from the receiving station 2024 to the working station 2018 via the transfer station 2022 and the tacking station 2020, the operator can receiving the transporting sheet assembly 2035 without any need for himself to move, thereby facilitating the operation.

In addition, in this embodiment, since the alignment between the image sheet 2026 and the image-receiving sheet 2028 can be facilitated, no expert skill is required in the operation and registering can be easily performed by any operator.

Sine the image transfer apparatus in accordance with this embodiment is automated, productivity can be enhanced and a reduction in costs can be attained.

Although the return of the brush 2070 to it initial position occurs while the transporting sheet 2035 is being cooled, the return may be effected any time after the transporting sheet 2035 has passed through the tacking station 2020.

Although a description has been given of a case in which a developed image on the image sheet 2026 is transferred after superposing the image sheet 2026 on the image-receiving sheet 2028, the apparatus in accordance with the present invention is also applicable to a case where paper transfer is effected after superposing the image-receiving sheet 2028 for which transfer has been completed, on the sheet to be transferred such as paper. In this case, it is possible to effect a transfer operation without using the positioning pins 2068 of the positioning mechanism 2036 and the tacking roller 2158 of the tacking station 220.

FIFTH EMBODIMENT

Figure 27:
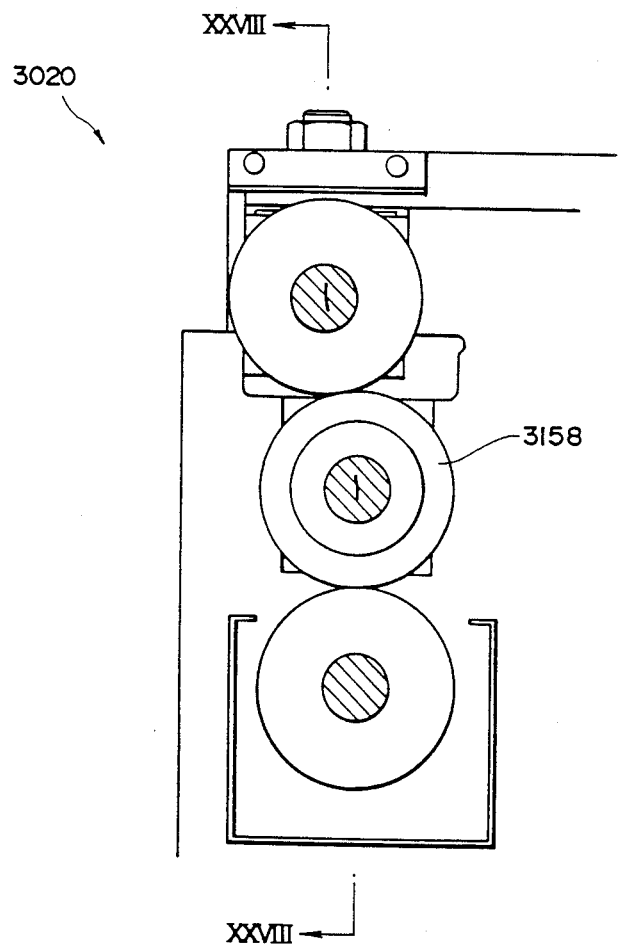
FIG. 27 is a sectional view showing relationships between a tacking roller and a heat roller in accordance with a fifth embodiment of the present invention.
Figure 28:
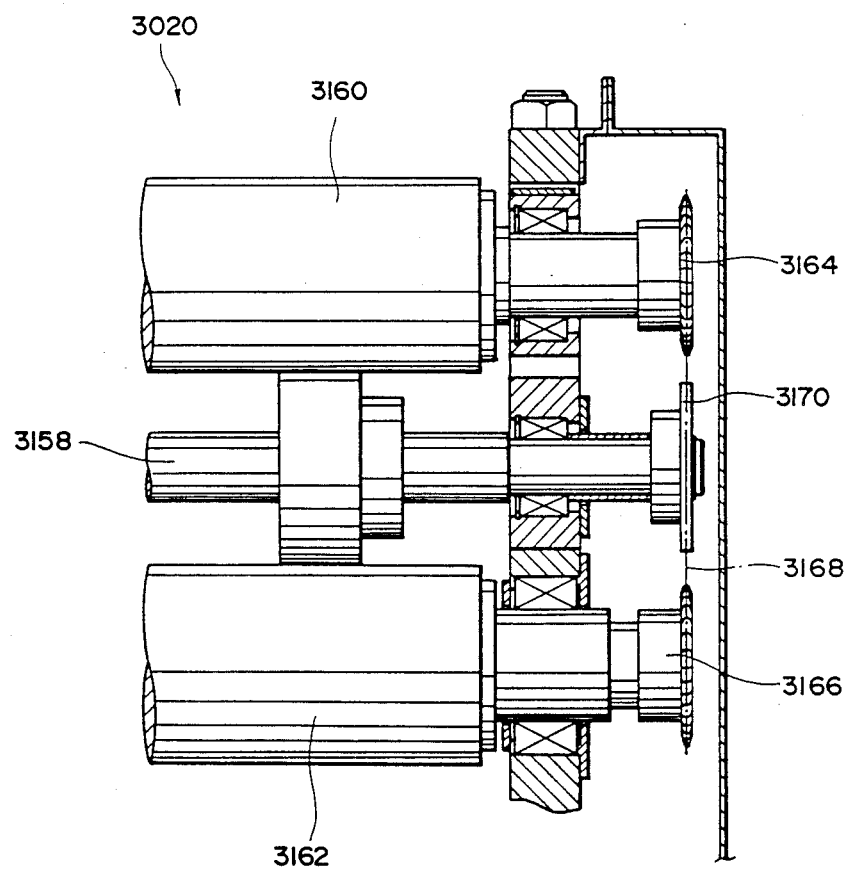
FIG. 28 is a sectional view taken along line XXIX—XXIX in FIG. 27, illustrating a driving system for the tacking roller and the heat roller.

Referring now to FIGS. 27 and 28, a description will be given of a fifth embodiment of the present invention.

This embodiment concerns a structure for heating a tacking roller 3158 of a tacking station 3020. The structure of the tacking roller 3158 shown in this embodiment can be applied to the above-described first, second, third and fourth embodiments.

As shown in FIG. 27, a heat roller 3160 is disposed on the upper periphery of the tacking roller 3158. The heat roller 3160 may incorporate a bar heater in its interior, or another type of heat roller may be used as the heat roller 3160. This heat roller 3160 abuts against the tacking roller 3158 to heat the same.

In addition, a roller 3162 is disposed underneath the tacking roller 3158. The transporting sheet assembly 2035 is inserted into a nip between the roller 3162 and the tacking roller 3158.

As shown in FIG. 28, the roller 3162 and the heat roller 3160 are respectively provided with sprockets 3164, 3166, and a chain belt 3168 is stretched between and wound around these sprockets 3164, 3166.

The tacking roller 3158 is provided with a pulley 3170, which rotates by abutting against the chain belt 3168.

Although in the above-described embodiments a description has been given of the transporting drive system, first inserting means and second inserting means for transporting the transporting sheet, the present invention is not confined to this arrangement and another transporting means may be adopted.

In addition, although in the above-described embodiments the transporting sheet assembly is inserted from the working station into the transfer station, and from the receiving station into the transfer station, the present invention is not confined to this arrangement, and the transporting sheet may be inserted directly into the transfer station.

What is claimed is:
1. An image transfer apparatus for transferring an image on an image sheet to an image-receiving sheet, comprising:
   a working station for placing said image sheet and said image-receiving sheet one above the other on a support member to make up a transported sheet assembly;
   a tacking station for tentatively securing said image sheet and said image-receiving sheet of said transported sheet assembly together;
   a transfer station for applying either pressure or pressure and heat to said transported sheet assembly tentatively secured in said tacking station, thereby to transfer said image to said image-receiving sheet; and
   feed means for feeding said transported sheet assembly from said working station through said tacking station to said transfer station in sequence.

2. An image transfer apparatus according to claim 1, wherein said working station comprises aligning means to align said image sheet and said image-receiving sheet of said transported sheet assembly with each other, and flattening means to flatten said image sheet and said image-receiving sheet of said transported sheet assembly.

3. An image transfer apparatus according to claim 2, wherein said image transfer apparatus further comprises a receiving station to receive said transported sheet assembly after said image has been transferred to said image-receiving sheet in said transfer station.

4. A image transfer apparatus according to claim 3, wherein said receiving station comprises cooling means to cool said transported sheet assembly.

5. An image transfer apparatus according to claim 2, wherein said aligning means comprises aligning members which can penetrate through said support member in the depthwise direction thereof and project to be capable of aligning said image sheet and said image-receiving sheet placed one above the other on said support member, first drive means for moving said aligning members in the depthwise direction of said support member, and control means for actuating said first drive means to cause said aligning members to penetrate through and project out of said support member during alignment, and cause to said aligning members to withdraw from said support member during the time except for alignment.

6. An image transfer apparatus according to claim 2, wherein said feed means comprises restricting means to restrict movement of said transported image assembly substantially normal to the direction of travel thereof.

7. An image transfer apparatus according to claim 6, wherein said image transfer apparatus further comprises first return means for returning said transported image assembly to said working station after completion of said image transfer.

8. An image transfer apparatus according to claim 1, wherein said tacking means is arranged to tentatively secure said transported image assembly by applying either pressure or pressure and heat to said transported image assembly in the depthwise direction thereof.

9. An image transfer apparatus according to claim 8, wherein said tacking means comprises a stepped type roller which is brought into pressure contact with said transported image assembly in the depthwise direction thereof before said transported image assembly is advanced to said transfer station by said feed means.

10. An image transfer apparatus according to claim 8, wherein said tacking means comprises a heat roller, a stepped type roller located opposite to said heat roller, and second drive means for driving one of said heat roller and said stepped type roller toward the other, thereby pressing said transported image assembly while being advanced therebetween to tentatively secure said image sheet and said image-receiving sheet together.

11. An image transfer apparatus according to claim 2, wherein said flattening means comprises a brush disposed to extend in the widthwise direction of said transported image assembly in facing relation to said image sheet and said image-receiving sheet of said transported image assembly placed one above the other, and moving means to move said brush in the direction of travel of said transported image assembly while keeping slide contact with the facing side of said image sheet and said image-receiving sheet of said transported image assembly placed one above the other.

12. An image transfer apparatus according to claim 11, wherein said moving means comprises second return means for returning said brush to an initial position oppositely to the direction of travel of said transported image assembly after said brush has been moved in the direction of travel of said transported image assembly.

13. An image transfer apparatus according to claim 12, wherein said flattening means comprises guide means for guiding said brush in the direction of travel of said transported image assembly and the direction opposite thereto.

14. An image transfer apparatus according to claim 13, wherein said guide means comprises a first guide path for guiding said brush in the direction of travel of said transported image assebmly and a second guide path for guiding said brush oppositely to said direction of travel, said second guide path being set in a position more spaced from a travel path of said transported image assembly than said first guide path.

15. An image transfer apparatus according to claim 1, wherein said transfer station comprises a first pair of rollers for heating said transported image assembly while holding said transported image assebmly therebetween under pressure, a second pair of rollers disposed downstream of said first pair of rollers in the direction of travel of said transported image assembly for heating said transported image assembly while holding said transported image assembly therebetween under pressure, third drive means for rotatively driving said first and second pairs of rollers in the direction of travel of said transported image assembly, and transmission means disposed between respective rollers of said first and second pairs of rollers and said third drive means for transmitting drive power of said third drive means to the respective rollers of said first and second pairs of rollers so that outer circumferential speeds of the repsective rollers of said first and second pairs of rollers become substantially equal to one another, while said transported image assembly is being held between and advanced by the respective rollers of said first and second pairs of rollers.

16. An image transfer apparatus according to claim 5, wherein said third drive means includes fourth drive means for driving those rollers out of said first and second pairs of rollers on the side facing said image sheet and said image-receiving sheet of said transported image assembly placed one above the other, and fifth drive means for driving those rollers out of said first and second pairs of rollers on the side facing said support member of said transported image assembly.

17. An image transfer apparatus according to claim 16, wherein that roller out of said second pair of rollers on the side facing said support member of said transported image assembly is set to have a larger diameter than that roller out of said first pair of rollers on the side facing said support member of said transported image assembly.

18. An image transfer apparatus for transferring an image on an image sheet to an image-receiving sheet while said image sheet and said image-receiving sheet are held in a superposed condition, comprising:
    a working station for placing said image sheet and said image-receiving sheet one above the other on a support plate to make up a transported sheet assembly;
    a tacking station for tentatively securing said image sheet and said image-receiving sheet of said transported sheet assembly together;

a transfer station for applying either pressure or pressure and heat to said transported sheet assembly tentatively secured in said tacking station, thereby to transfer said image to said image-receiving sheet;

a cooling station for cooling said transported sheet assembly after said image has been transferred; and feed means for feeding said transported sheet assembly from said working station through said tacking station, said transfer station and said cooling station in this order in the direciton of travel of said transported sheet assembly, and then moving back said transported sheet assembly having been cooled from said cooling station through said transfer station, said tacking station and said working table in this order in the direction of travel of said transported sheet assembly.

19. An image transfer apparatus according to claim 18, wherein said working station comprises aligning means for aligning said image sheet and said image-receiving sheet of said transported sheet assembly with each other, and flattening means for flattening said image sheet and said image-receiving sheet of said transported sheet assembly.

20. An image transfer apparatus according to claim 19, wherein said transfer station comprises a pair of rollers for holding said transported sheet assembly therebetween to apply said pressure and heat.

21. A heat transfer method for transferring an image on an image sheet to an image-receiving sheet with said image sheet and said image-receiving sheet placed one above the other, comprising the steps of:

transporting said image sheet and said image-receiving sheet in a superposed state; to form a transported sheet assembly and allowing said superposed image sheet and image-receiving sheet to pass through a transfer station; and allowing said superposed image sheet and image-receiving sheet to pass again through said transfer station by backwardly transporting said superposed image sheet and image-receiving sheet, thereby transferring said image recorded on said image sheet to said image-receiving sheet.

22. A heat transfer method for transferring an image on an image sheet to an image-receiving sheet with said image sheet and said image-receiving sheet placed one above the other, comprising the steps of:

transporting said image sheet and said image-receiving sheet in a superposed state; to form a transported sheet assembly subjecting said superposed image sheet and said image-receiving sheet to at least pressurization while being passed through a transfer station so as to transfer said image recorded on said image sheet to said image-receiving sheet; and transporting said superposed image sheet and said image-receiving sheet in the backward direction so as to be returned to a position prior to transfer.

23. A heat transfer method for transferring an image on an image sheet to an image-receiving sheet with said image sheet and said image-receiving sheet placed one above the other, comprising the steps of:

transporting said image sheet and said image-receiving sheet in a superposed state to form a transported sheet assembly;

subjecting said superposed image sheet and said image-receiving sheet to at least pressurization while being passed through a transfer station; and transporting said superposed image sheet and said image-receiving sheet in the backward direction and subjecting said superposed image sheet and said image-receiving sheet to at least pressurization while being passed again through said transfer station, thereby transferring said image recorded on said image sheet to said image-receiving sheet.

24. An image transfer method according to any of claims 21, 22 and 23 further comprising steps of inserting into a transfer station and transporting said transported sheet assembly, said transported sheet assembly being formed by superposing said image sheet and said image receiving sheet on a support.

* * * * *